US012765433B2

(12) United States Patent
Chiu et al.

(10) Patent No.: US 12,765,433 B2
(45) Date of Patent: Oct. 13, 2026

(54) SEMICONDUCTOR STRUCTURES AND METHOD FOR MANUFACTURING A SEMICONDUCTOR STRUCTURE

(71) Applicant: SERIPHY TECHNOLOGY CORPORATION, Hsinchu County (TW)

(72) Inventors: Tzu-Wei Chiu, Hsinchu County (TW); Chun-Wei Chang, Taipei City (TW); Wei-Chih Chen, Taoyuan City (TW); Che-Yen Huang, Hsinchu County (TW)

(73) Assignee: SERIPHY TECHNOLOGY CORPORATION, Hsinchu County (TW)

( * ) Notice: Subject to any disclaimer, the term of this patent is extended or adjusted under 35 U.S.C. 154(b) by 607 days.

(21) Appl. No.: 18/194,071

(22) Filed: Mar. 31, 2023

(65) Prior Publication Data

US 2024/0203848 A1 Jun. 20, 2024

Related U.S. Application Data

(60) Provisional application No. 63/387,568, filed on Dec. 15, 2022.

(51) Int. Cl.
*H10W 90/00* (2026.01)
*H10B 80/00* (2023.01)
(Continued)

(52) U.S. Cl.
CPC .......... *H10W 90/701* (2026.01); *H10B 80/00* (2023.02); *H10W 70/05* (2026.01);
(Continued)

(58) Field of Classification Search
CPC .......... H10B 80/00; H01L 2221/68345; H01L 21/568; H01L 21/6835; H01L 23/49816;
(Continued)

(56) References Cited

U.S. PATENT DOCUMENTS

| | | | |
|---|---|---|---|
| 9,607,967 | B1 | 3/2017 | Shih |
| 2015/0303174 | A1 | 10/2015 | Yu |

(Continued)

OTHER PUBLICATIONS

Notice of Allowance dated Jul. 15, 2026, related to the US family patent application.

(Continued)

*Primary Examiner* — Evan G Clinton
(74) *Attorney, Agent, or Firm* — WPAT, P.C.; Anthony King

(57) ABSTRACT

The present application discloses a semiconductor structure and a method for manufacturing a semiconductor structure. The semiconductor structure includes at least one bottom die and a plurality of top dies. The semiconductor structure further includes a redistribution layer (RDL) formed on the at least one bottom die, and a plurality of micro bumps formed on the RDL. The top dies is stacked on the bottom die with their front sides being attached to the micro bumps. The RDL allows communication between a top die and the bottom die and allows the communication between adjacent top dies. The die-stacking structure enables greater computation capability within a smaller area.

20 Claims, 28 Drawing Sheets

(51) Int. Cl.
*H10W 70/05* (2026.01)
*H10W 70/60* (2026.01)
*H10W 70/685* (2026.01)
*H10W 74/01* (2026.01)
*H10W 74/10* (2026.01)
*H10W 72/00* (2026.01)

(52) U.S. Cl.
CPC ........ *H10W 70/611* (2026.01); *H10W 70/685* (2026.01); *H10W 74/01* (2026.01); *H10W 74/117* (2026.01); *H10W 74/131* (2026.01); *H10W 90/00* (2026.01); *H10W 90/401* (2026.01); *H10W 72/07236* (2026.01); *H10W 90/724* (2026.01)

(58) Field of Classification Search
CPC ..... H01L 24/13; H01L 25/0652; H01L 25/16; H01L 25/18
USPC .................. 257/686, 25.006, 25.013, 25.021
See application file for complete search history.

(56) References Cited

U.S. PATENT DOCUMENTS

| | | | | |
|---|---|---|---|---|
| 2017/0040266 | A1* | 2/2017 | Lin | H01L 23/5389 |
| 2017/0365587 | A1* | 12/2017 | Hung | H01L 21/486 |
| 2019/0103386 | A1* | 4/2019 | Chen | H01L 24/19 |
| 2019/0157228 | A1* | 5/2019 | Yu | H01L 23/3192 |
| 2021/0305086 | A1 | 9/2021 | Yu | |
| 2023/0187363 | A1 | 6/2023 | Lin | |
| 2024/0120282 | A1 | 4/2024 | Chiu et al. | |
| 2024/0203848 | A1 | 6/2024 | Chiu et al. | |
| 2024/0203941 | A1 | 6/2024 | Chiu et al. | |

OTHER PUBLICATIONS

Office Action dated May 26, 2026, related to the US family patent applications.

* cited by examiner

SEMICONDUCTOR STRUCTURES AND METHOD FOR MANUFACTURING A SEMICONDUCTOR STRUCTURE

CROSS REFERENCE

This application claims the benefit of prior-filed U.S. provisional application No. 63/387,568, filed on Dec. 15, 2022, which is incorporated by reference in its entirety.

TECHNICAL FIELD

The present disclosure relates to a semiconductor structure, and more particularly, to a semiconductor structure having a die-stacking structure.

DISCUSSION OF THE BACKGROUND

As the artificial intellectual (AI) models have been applied to more and more fields, a demand for suitable hardware having greater computation capability also raises. Since the AI models usually require large amounts of parallel computing, most of the computation hardware includes multiple cores, which requires large circuit area. Furthermore, to improve the computation efficiency, data sharing and/or data switching among different cores is also desired. However, to enable data sharing and/or data switching, connections between cores can be complicated and require even larger area. Therefore, providing a semiconductor structure that can facilitate greater computation capability within a smaller area has become an issue to be solved.

SUMMARY

One embodiment of the present disclosure discloses a semiconductor structure. The semiconductor structure includes a dielectric layer, a first redistribution layer, a plurality of bumps, a plurality of first micro bumps, at least one bottom die, a plurality of conductive pillars, a first molding layer, a second RDL, a plurality of second micro bumps, and a plurality of top dies. The first RDL is disposed on a first surface of the dielectric layer. The plurality of bumps are disposed on a second surface of the dielectric layer. The plurality of first micro bumps are disposed on the first RDL. The at least one of bottom die is attached to the plurality of first micro bumps. The plurality of conductive pillars are disposed on the first RDL. The first molding layer is configured to fill spaces among and around the at least one of bottom die and the plurality of conductive pillars on the first RDL. The second RDL is disposed on the first molding layer, wherein the second RDL is coupled to the at least one of bottom die, and the second RDL further coupled to the plurality of conductive pillars. The plurality of second micro bumps is disposed on the second RDL. The plurality of top dies are attached to the plurality of second micro bumps.

Another embodiment of the present disclosure discloses a method for manufacturing a semiconductor structure. The method includes forming a dielectric layer on a first carrier, forming a first RDL on a first surface of the dielectric layer, forming a plurality of first micro bumps on the first RDL, forming a plurality of conductive pillars on the first RDL, attaching at least one of bottom die to the plurality of first micro bumps, forming a molding layer to fill spaces among and around the at least one of bottom die and the plurality of conductive pillars on the first RDL, forming a second RDL on the molding layer coupled to the at least one of bottom die the plurality of conductive pillars, forming a plurality of second micro bumps on the second RDL, attaching a plurality of top dies to the plurality of second micro bumps, forming a second molding layer on the plurality of top dies, adhering a second carrier on back sides of the plurality of top dies, detaching the first carrier, forming a plurality of openings in the dielectric layer, and form a plurality of bumps in the plurality of openings from a second surface of the dielectric layer.

The semiconductor structure and the method for manufacturing the semiconductor structure adopts the die-stacking structure to accommodate multiple core dies within one package. The die-stacking structure not only allows greater computation capability within a smaller area but also enables faster data sharing and/or data switching.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
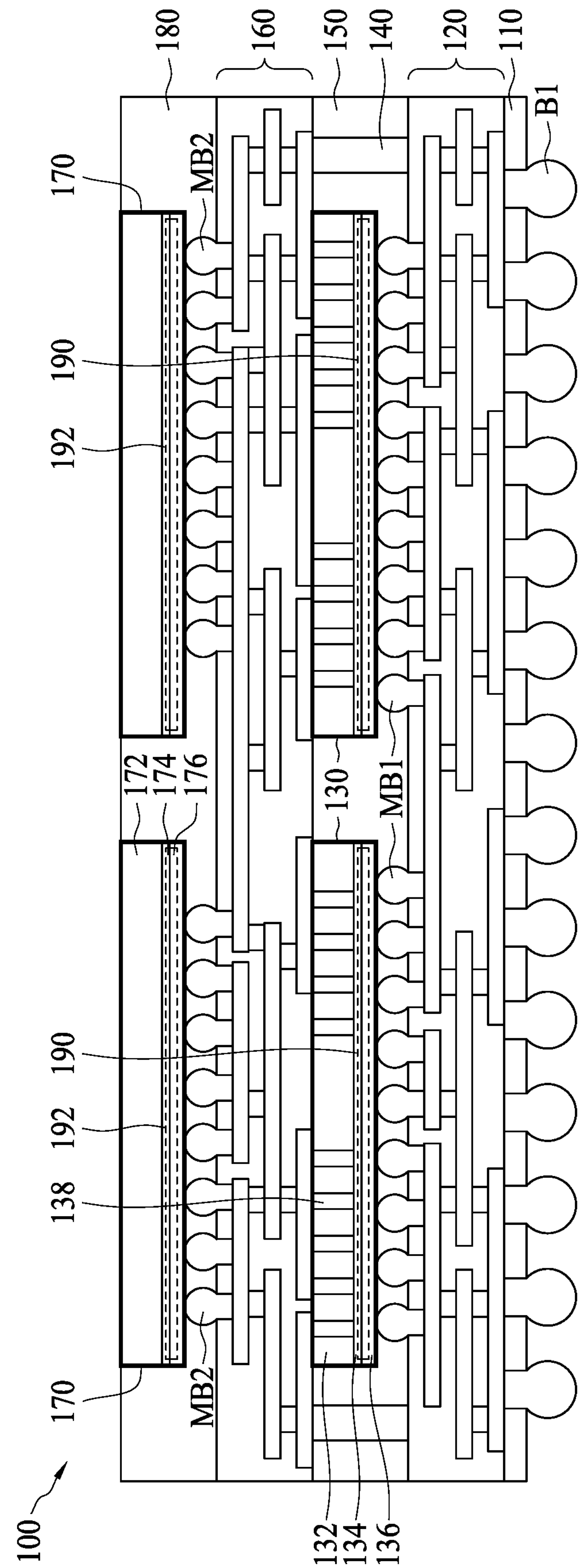
FIG. 1 shows a semiconductor structure according to one embodiment of the present disclosure.

FIG. 1 shows a semiconductor structure 100 according to one embodiment of the present disclosure. As shown in FIG. 1, the semiconductor structure 100 includes a dielectric layer 110, a redistribution layer (RDL) 120, a plurality of bumps B1, a plurality of micro bumps MB1, at least one bottom die 130, a plurality of conductive pillars 140, a molding layer 150, a RDL 160, a plurality of micro bumps MB2, and a plurality of top dies 170.

The RDL 120 can be disposed on a first surface of the dielectric layer 110, and the bumps B1 can be disposed on a second surface of the dielectric layer 110. The micro bumps MB1 can be disposed on the RDL 120, and the bottom die 130 can be attached to the micro bumps MB1. In the present embodiment, each of the bottom die 130 can include a backside substrate 132, a device layer 134 formed on the backside substrate 132, a RDL 136 formed on the device layer 134, and a plurality of through silicon vias (TSVs) 138 formed in the backside substrate 132. In addition, the bottom dies 130 can be attached to the micro bumps MB1 with the RDLs 136 of the bottom dies 130 facing the micro bumps MB1. That is, the bottom dies 130 can be disposed on the RDL 120 and attached to the micro bumps MB1 in a face-down manner. However, the present disclosure is not limited thereto.

As shown in FIG. 1, the conductive pillars 140 can be disposed on the RDL 120, and the molding layer 150 can fill spaces among and around the bottom dies 130 and the conductive pillars 140 on the RDL 120 so as to protect the bottom dies 130, the conductive pillars 140, and the soldering between the bottom dies 130 and the micro bumps MB1. In some embodiment, the molding layer 150 can include mold-underfill (MUF) material that can both molding the bottom dies 130 and filling gaps between the micro bumps MB1 in one process; however, the present disclosure is not limited thereto. In some other embodiments, the molding layer 150 may include an underfill sub-layer that can fill the gaps between the micro bumps MB1, and a molding sub-layer that molds the bottom dies 130

Furthermore, the RDL 160 can be disposed on the molding layer 150 with the RDL 160 coupled to the bottom dies 130 and the conductive pillars 140. The micro bumps MB2 can be disposed on the RDL 160, and the top dies 170 can be attached to the micro bumps MB2. In the present embodiment, each of the top dies 170 can include a backside substrate 172, a device layer 174 formed on the backside substrate 172, and a RDL 176 formed on the device layer 174. Also, the top dies 170 can be attached to the micro bumps MB2 with the RDL 176 of the top dies 170 facing the micro bumps MB2, that is, the top dies 170 can also be disposed in a face-down manner. In such case, the top dies 170 may receive power from the bumps B1 through the RDL 120, the conductive pillars 140, the RDL 160, and the micro bumps MB2.

In addition, the semiconductor structure 100 may further includes a molding layer 180 disposed on the RDL 160, and the molding layer 180 can fill spaces among and around the top dies 170 so as to protect the top dies 170 and the soldering between the top dies 170 and the micro bumps MB2. In some embodiment, the molding layer 180 can include mold-underfill (MUF) material that can both molding the top dies 170 and filling gaps between the micro bumps MB2 in one process; however, the present disclosure is not limited thereto. In some other embodiments, the molding layer 180 may include an underfill sub-layer that can fill the gaps between the micro bumps MB2, and a molding sub-layer that molds the top dies 170.

In some embodiments, the bottom dies 130 and the top dies 170 can be chiplet core dies. For example, each of the bottom dies 130 may include a computation circuit 190 formed in the device layer 134 and the RDL 136, and each of the top dies 170 may include a computation circuit 192 formed in the device layer 174 and the RDL 176. In some embodiments, sizes of the bottom dies 130 can be same as sizes of top dies, and in some embodiments, the bottom dies 130 and the top dies 170 can be identical. However, the present disclosure is not limited thereto; in some other embodiments, the bottom dies 130 may be different from the top dies 170 in terms of sizes and/or functions.

Figure 2:
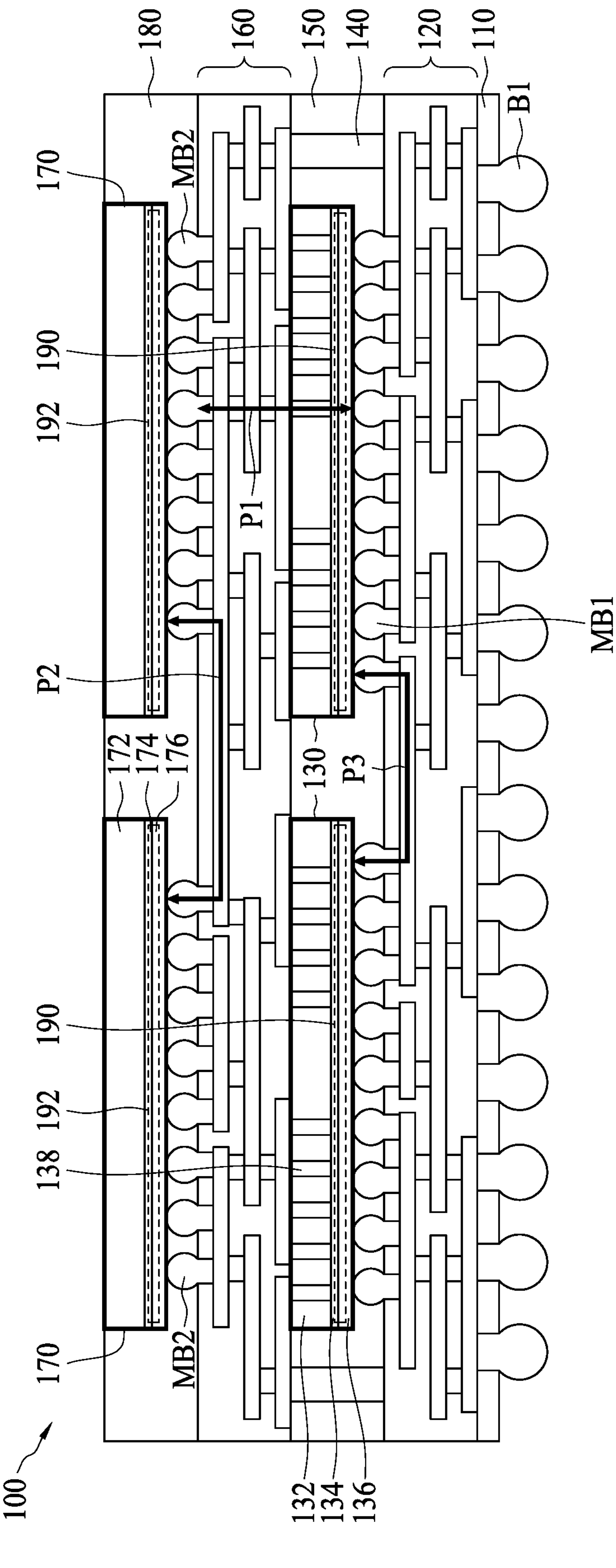
FIG. 2 shows signal transmission paths in the semiconductor structure 100 according to one embodiment of the present disclosure.

FIG. 2 shows signal transmission paths in the semiconductor structure 100 according to one embodiment of the present disclosure. As shown in FIG. 2, signals can be transmitted to and fro along signal paths formed between computation circuits 192 of the top dies 170 and computation circuits 190 of the bottom dies 130. For example, a computation circuit 192 may transmit a signal to a computation circuit 190 along the signal path P1 from the micro bumps MB2, the RDL 160, and the TSVs 138 of the bottom die 130.

Furthermore, signals can be transmitted to and fro along signal paths formed between the computation circuits 192 of adjacent top dies 170. For example, a computation circuit 192 of a top die 170 may transmit a signal to a computation circuit 192 of another top die 170 along the signal path P2 provided by the RDL 160. Similarly, signals can be transmitted to and fro along signals paths formed between the computation circuits 190 of adjacent bottom dies 130. For example, a computation circuit 190 of a bottom die 130 may transmit a signal to a computation circuit 190 of another bottom die 130 along the signal path P3 provided by the RDL 120.

That is, in the present embodiment, the top dies 170 can be stacked on the bottom dies 130, and can be coupled to the bottom dies 130 through the RDL 160, which allows communications between the top dies 170 and the bottom dies 130. In addition, adjacent top dies 170 can also communicate with each other through the RDL 160, and adjacent bottom dies 130 can communicated with each other through the RDL 120. Therefore, the die-stacking structure in the semiconductor structure 100 allows a multi-core system to achieve not only greater computation capability but also faster data sharing within a smaller area. Furthermore, since the bottom dies 130 and the top dies 170 can be bonded on micro bumps MB1 and MB2, cost required by high end processes, such as hybrid bonding, can be saved, making the manufacturing of the semiconductor structure 100 even more cost-effective.

Figure 3:
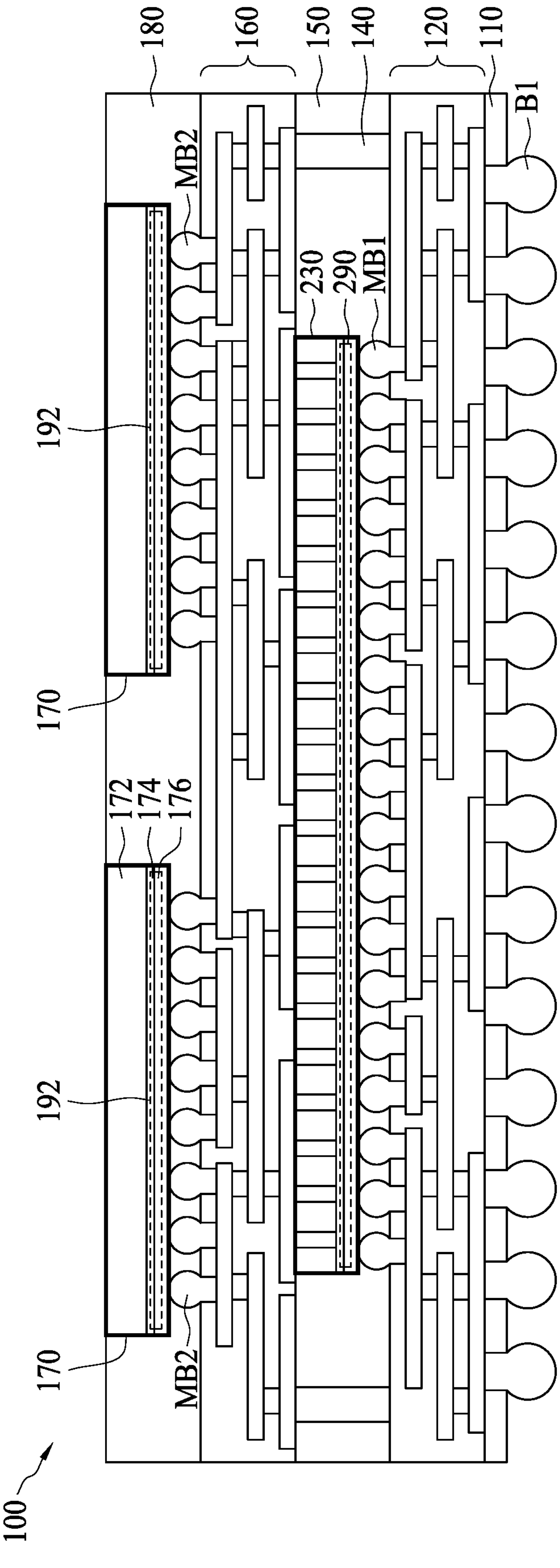
FIG. 3 shows a semiconductor structure according to another embodiment of the present disclosure.

In the embodiment shown in FIG. 1, the semiconductor structure 100 includes a plurality of bottom dies 130 and each includes a computation circuit 190; however, the present disclosure is not limited thereto. In some embodiments, the semiconductor structure 100 may include only one bottom die, and the bottom die may include other types of circuits. FIG. 3 shows a semiconductor structure 200 according to another embodiment of the present disclosure. The semiconductor structure 200 and the semiconductor structure 100 have similar structures, however, the semiconductor structure 200 includes one bottom die 230. In some embodiments, the bottom die 230 can be a memory die that includes a memory circuit 290, such as a static random access memory (SRAM) a resistive random-access memory (RRAM), and/or a magnetoresistive random-access memory (MRAM). In such case, the top dies 170 can be stacked on the same bottom die 230, and the computation circuits 192 in the top dies 170 can access the memory circuit 290 of the bottom die 230 through vertical transmission between dies provided by the RDL 160, thereby allowing fast data sharing among cores of different top dies 170.

In some embodiments, the bottom die 230 may include a plurality of deep trench capacitors (DTCs). In such case, the computation circuit 192 of the top dies 170 can also be coupled to the DTCs through the vertical transmission between dies provided by the RDL 160. The DTCs can be used to form dynamic random access memory (DRAM), phase lock loop (PLL) filters, or circuits of power applications according to the need.

Figure 4:
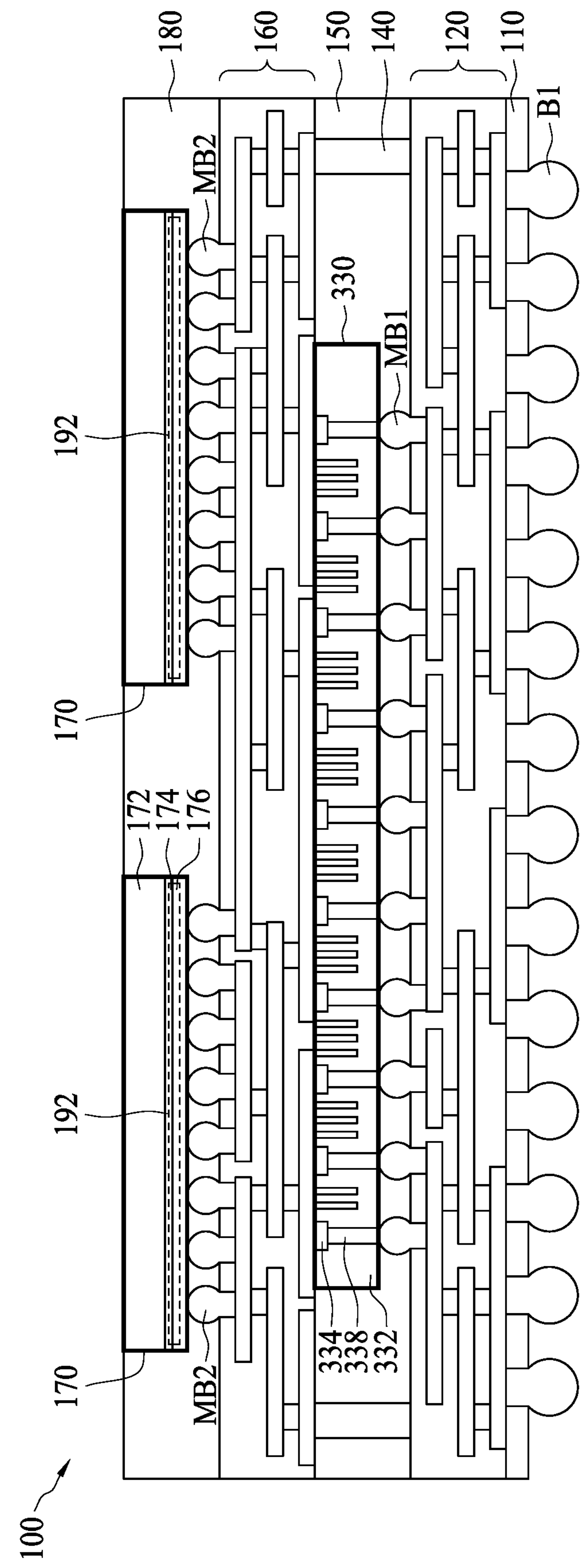
FIG. 4 shows a semiconductor structure according to another embodiment of the present disclosure.

Furthermore, in FIG. 1 and FIG. 3, the bottom dies 130 and 230 are disposed on the RDL 120 in a face-down manner, however, the present disclosure is not limited thereto. FIG. 4 shows a semiconductor structure 300 according to another embodiment of the present disclosure. The semiconductor structure 300 and the semiconductor structure 200 have similar structures, however, the bottom die 330 can include a plurality of DTCs and can be disposed on the RDL 120 in a face-up manner in the semiconductor structure 300. That is, the backside substrate 332 of the bottom die 330 can face the RDL 120 with the TSVs 338 formed within the backside substrate 332 being attached to the micro bumps MB1, and the electrodes 334 of the DTCs formed on the backside substrate 332 can be coupled to the RDL 120 through the TSVs 338.

Figure 5A:
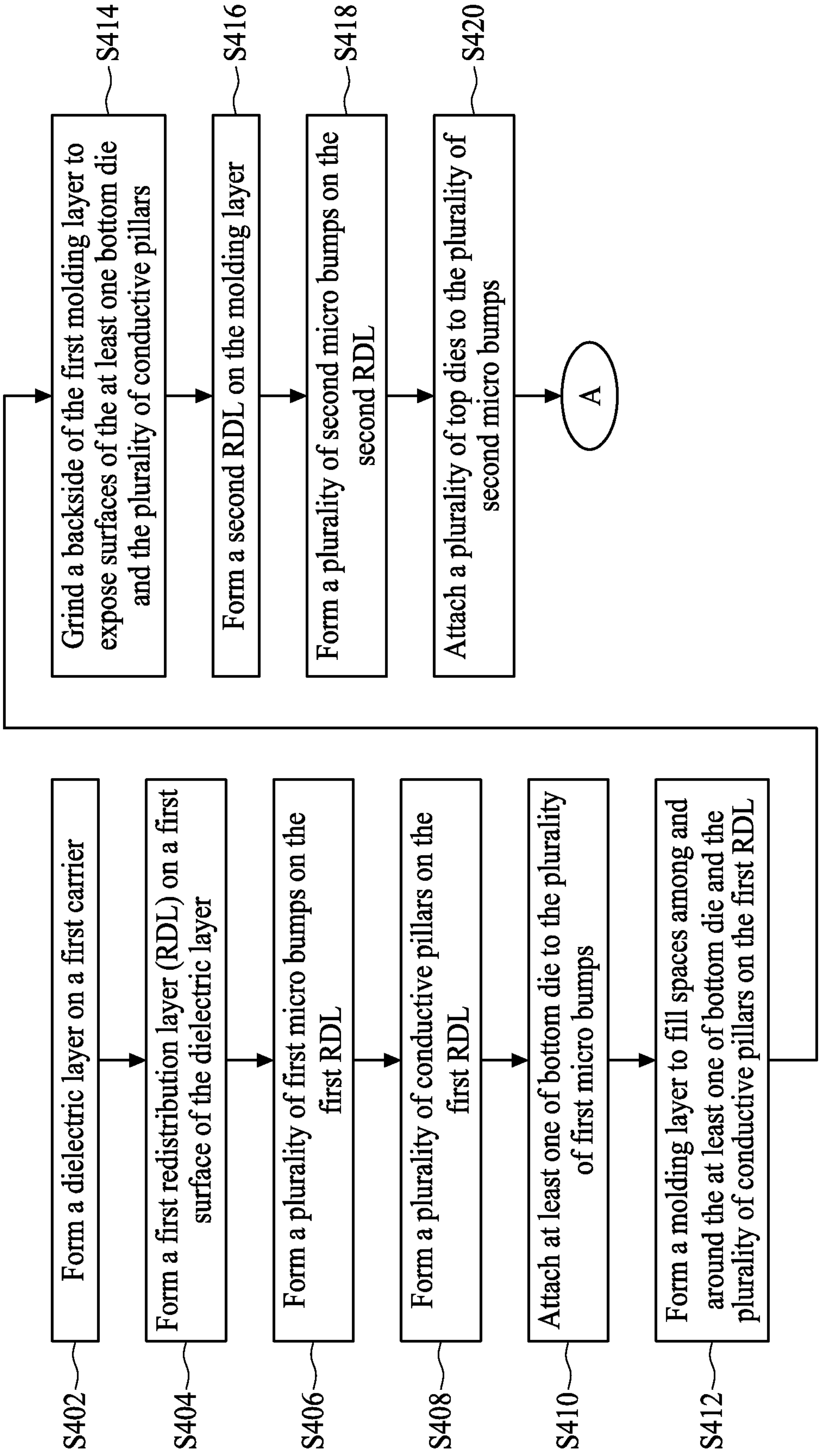
FIGS. 5A and 5B show a flowchart of a method for manufacturing a semiconductor structure according to one embodiment of the present disclosure.
Figure 5B:
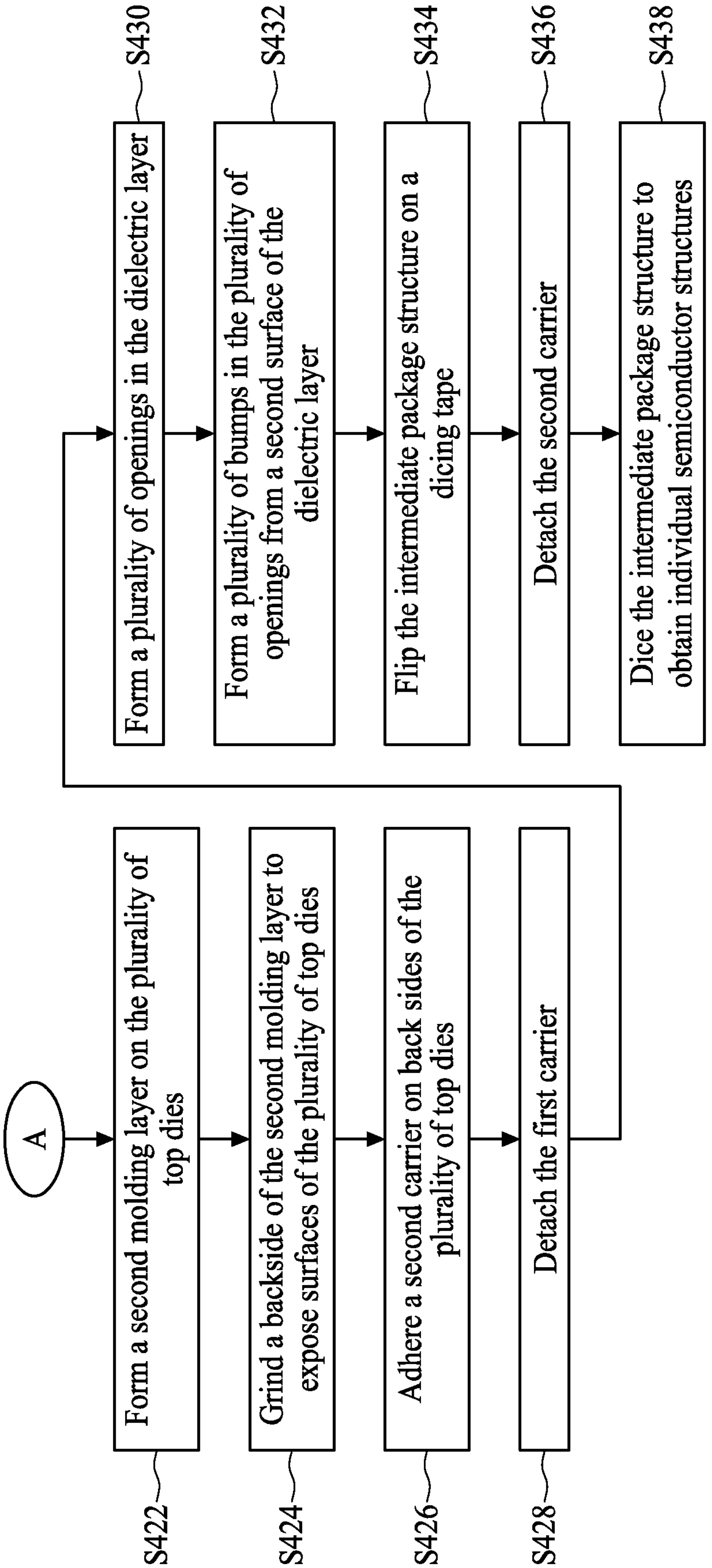

FIGS. 5A and 5B show a flowchart of a method M1 for manufacturing a semiconductor structure according to one embodiment of the present disclosure. In the present embodiment, the method M1 can be adopted to manufacture the semiconductor structure 100. Also, in some embodiments, the similar methods can be used to manufacture the semiconductor structures 200 and 300.

Figure 6A:
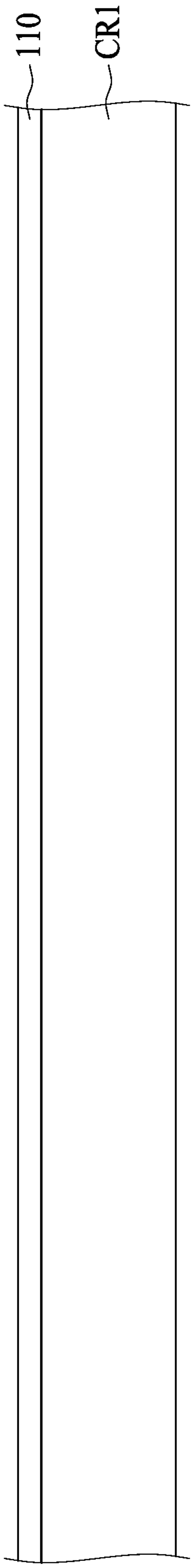
FIGS. 6A to 6S are schematic, cross-sectional diagrams showing a manufacturing process according to steps of the method in FIGS. 5A and 5B.
Figure 6B:
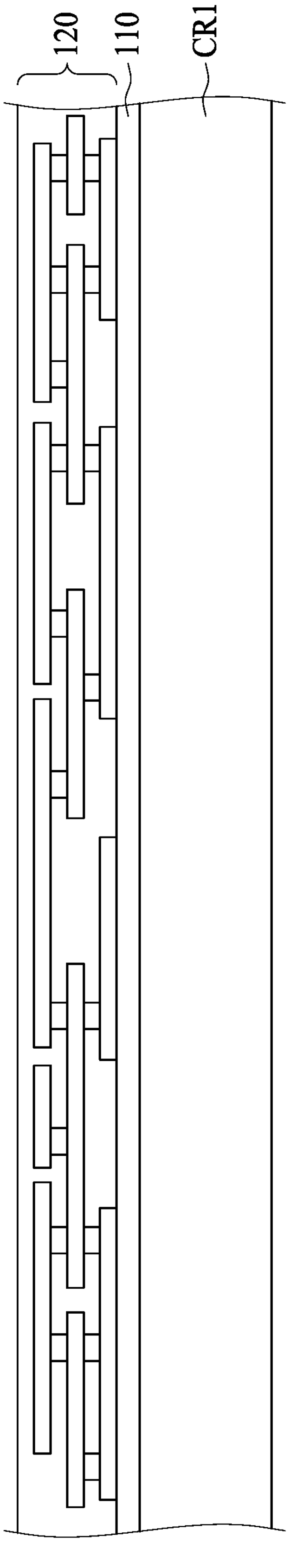
Figure 6C:
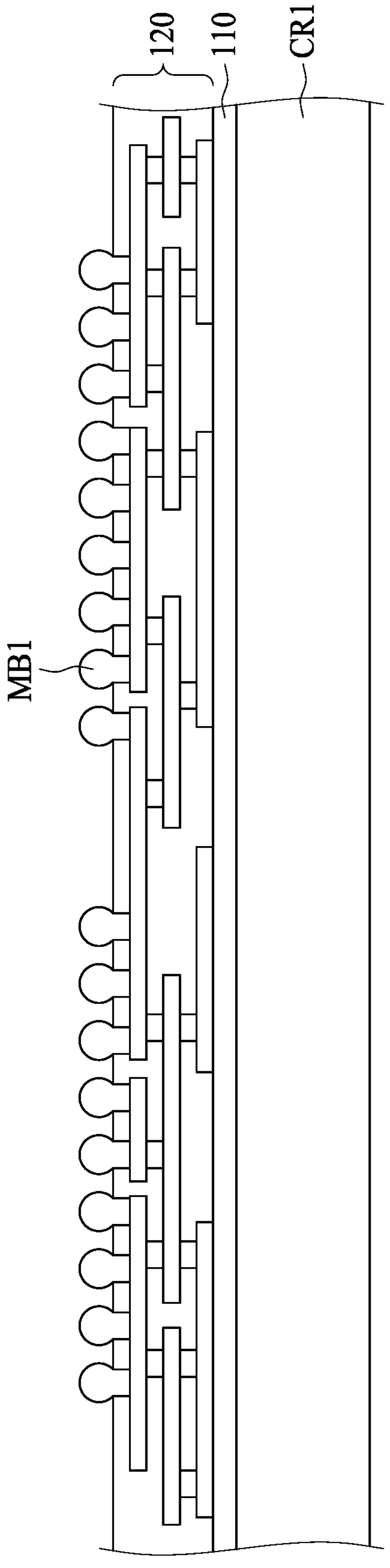
Figure 6D:
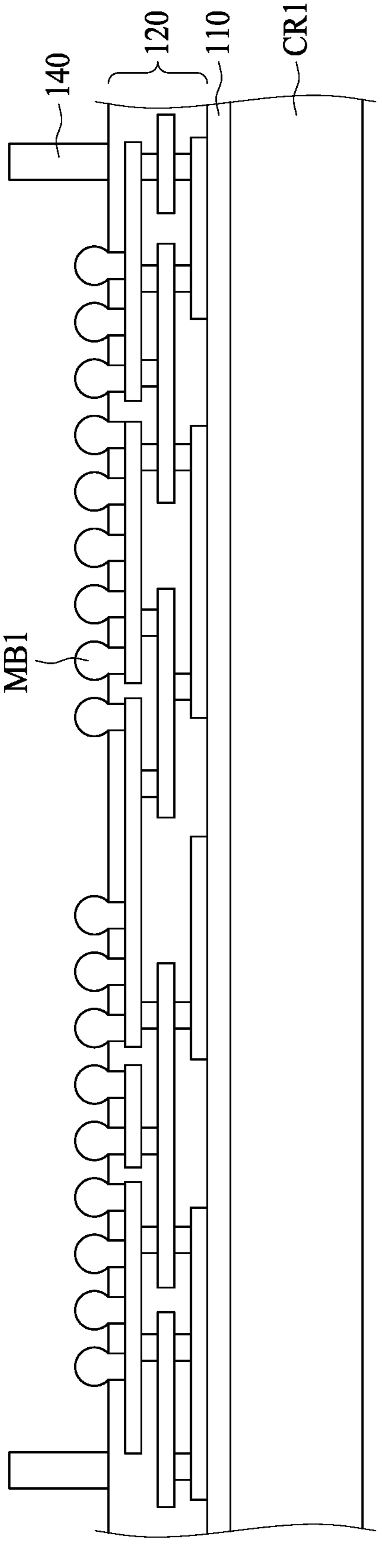
Figure 6E:
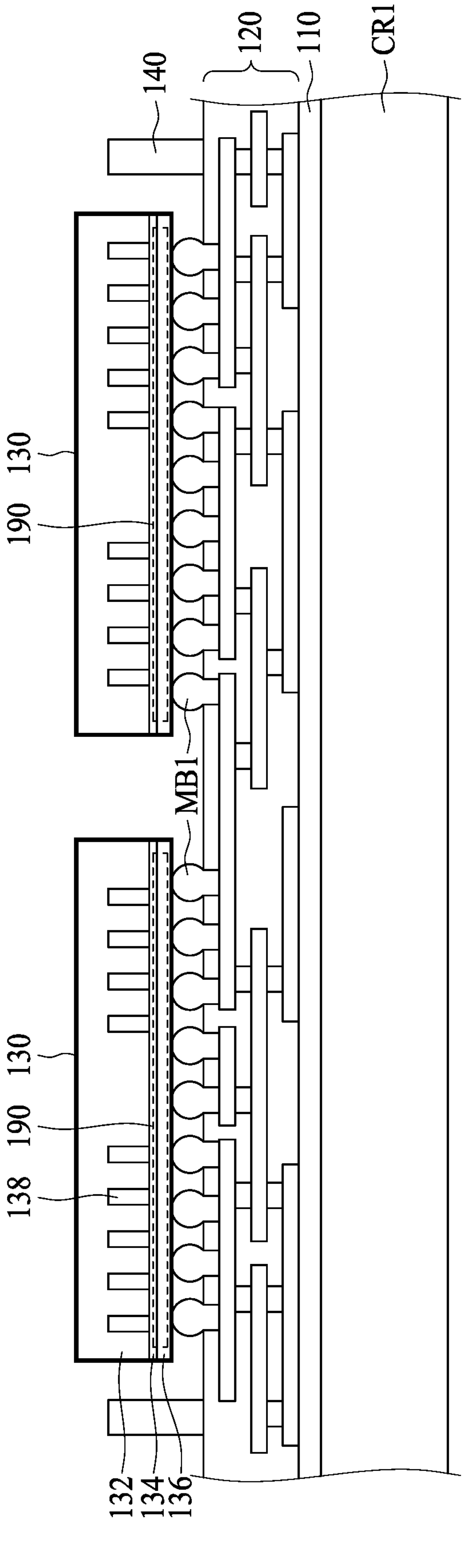
Figure 6F:
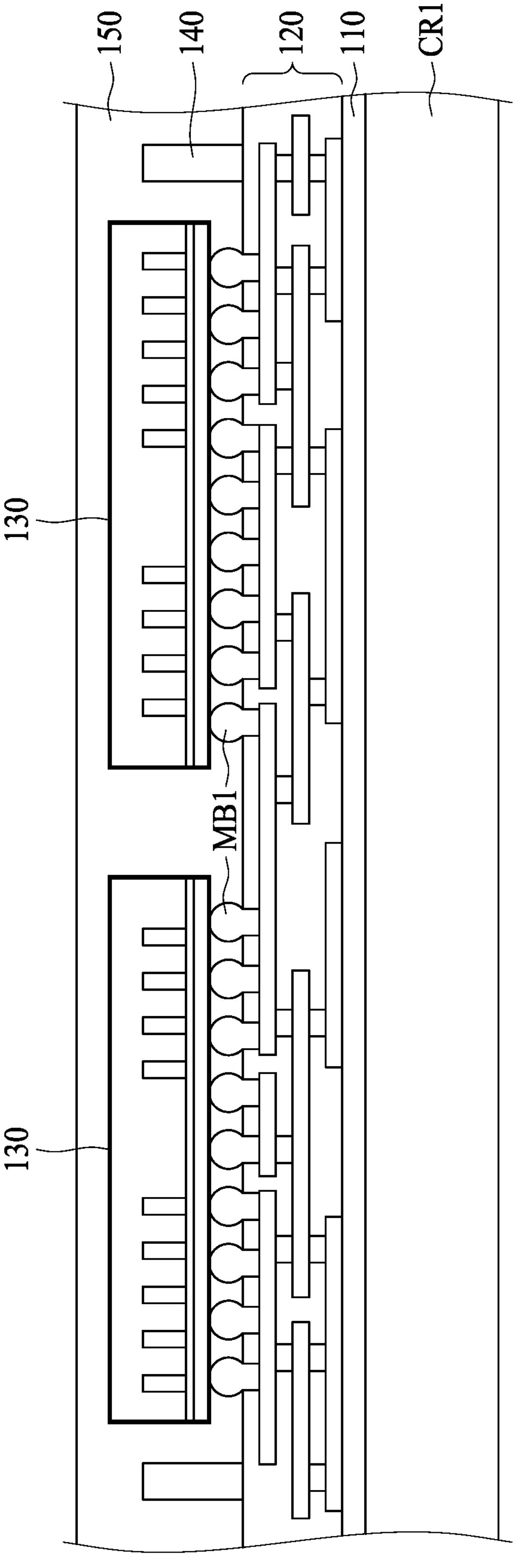
Figure 6G:
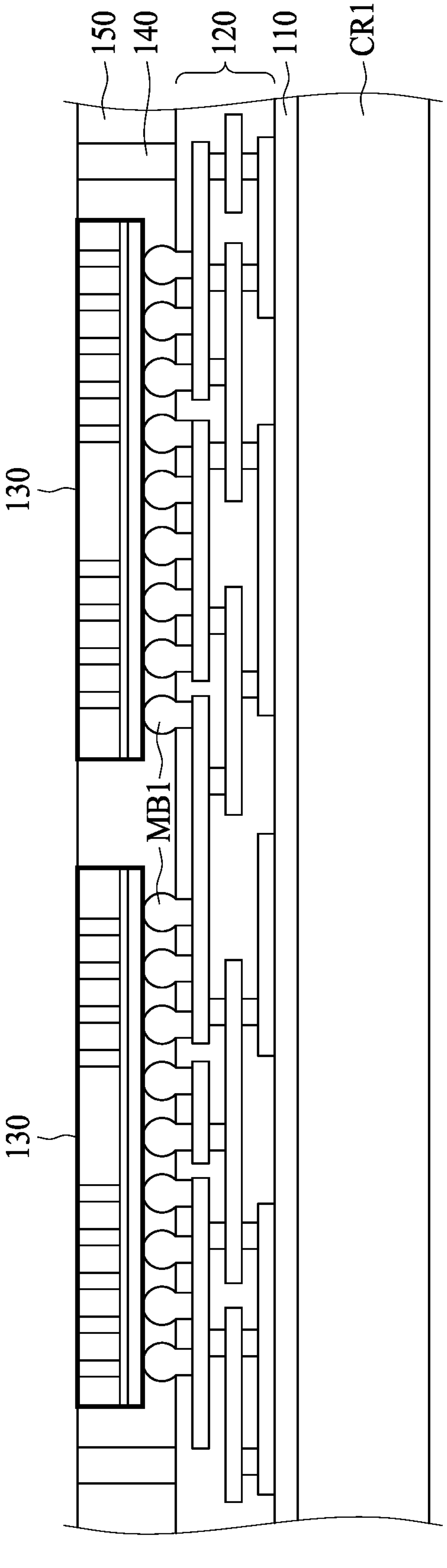
Figure 6H:
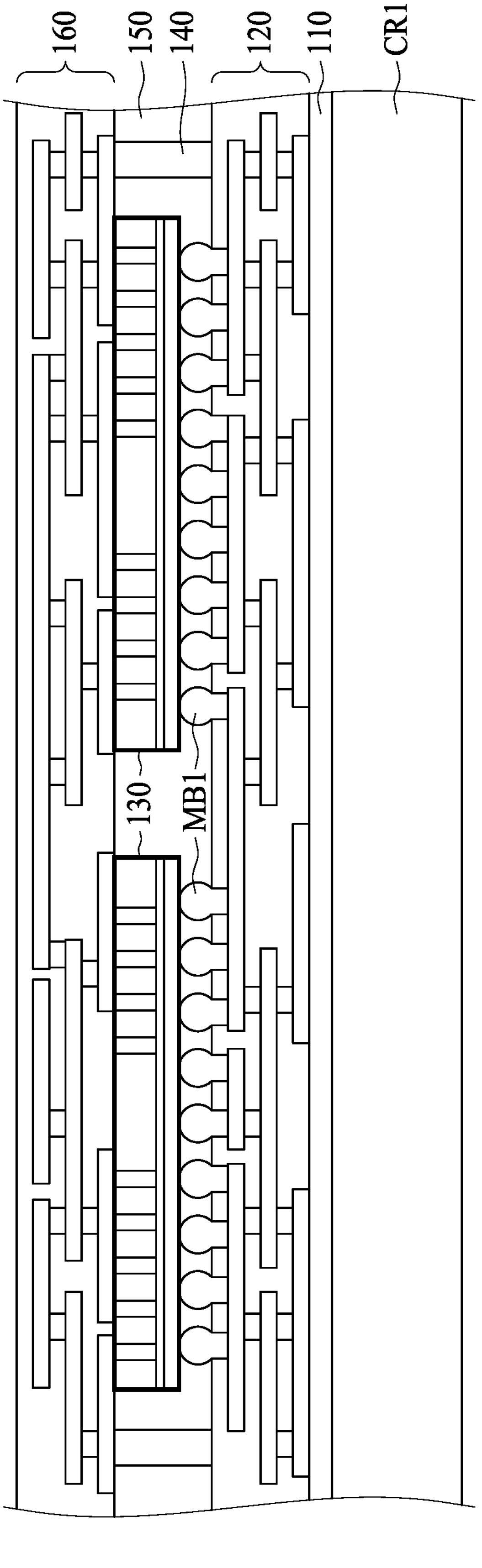
Figure 6I:
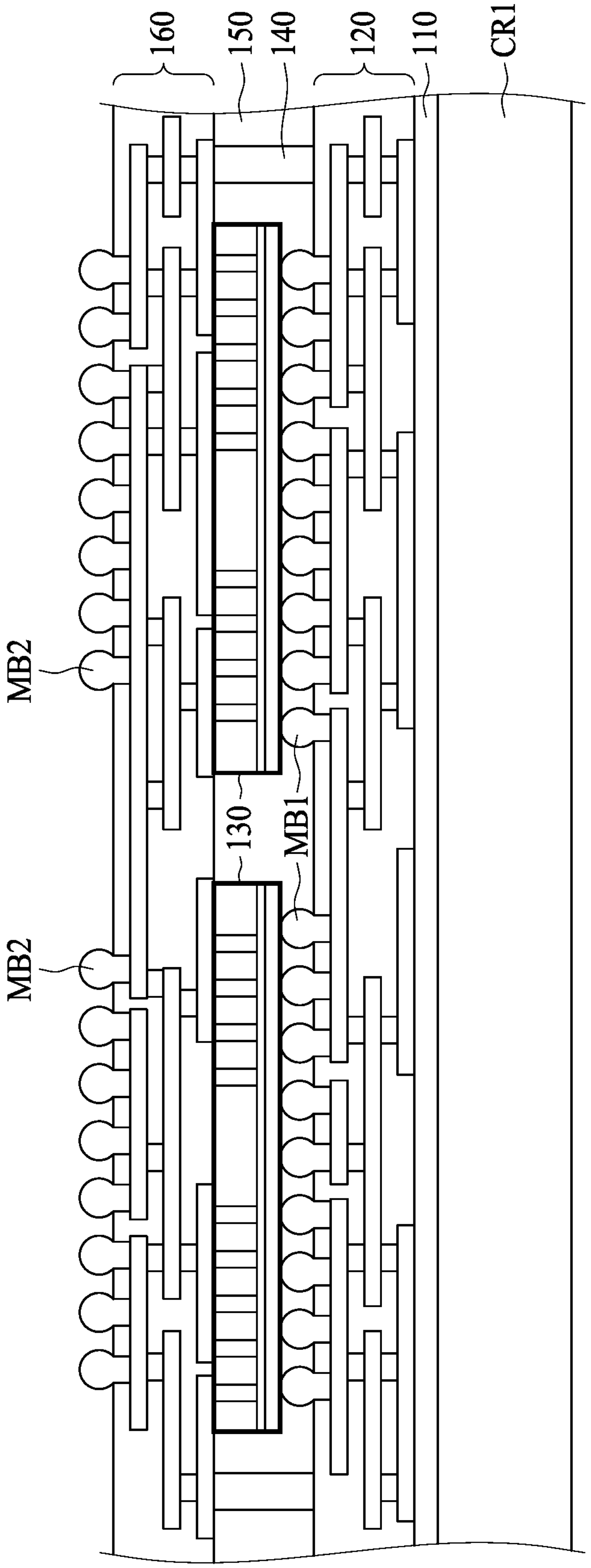
Figure 6J:
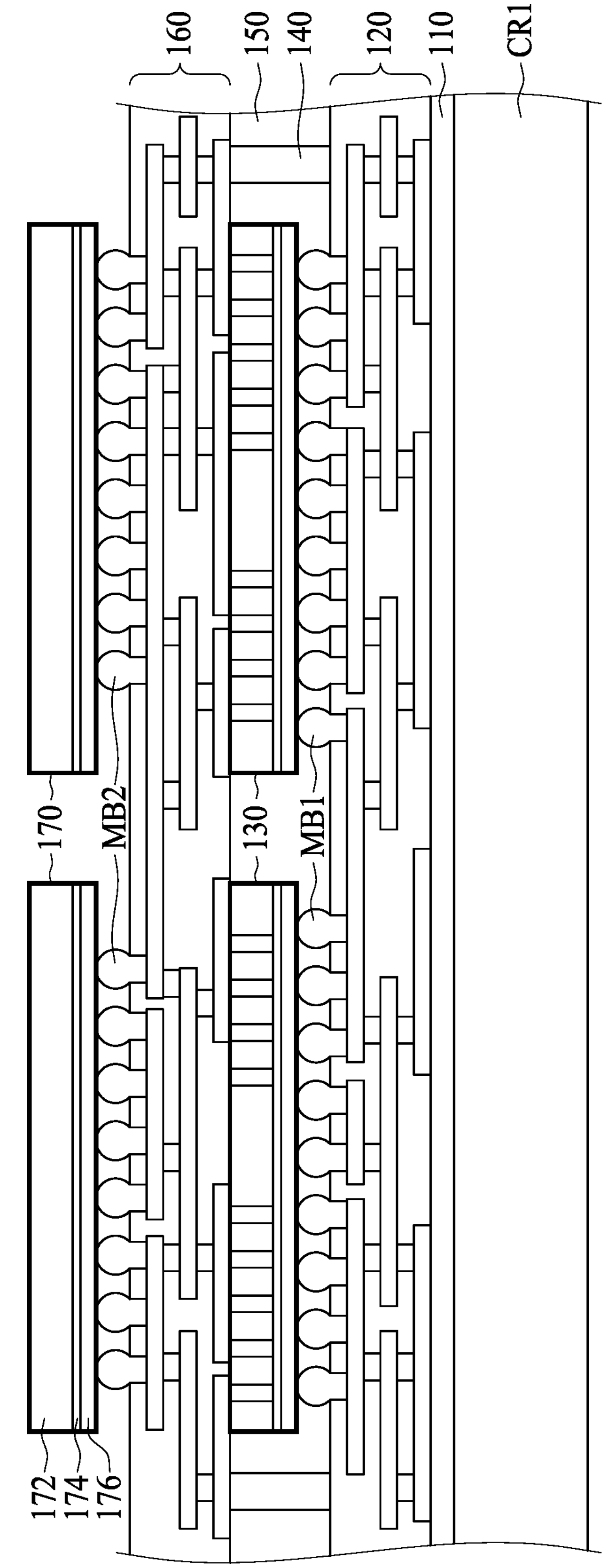
Figure 6K:
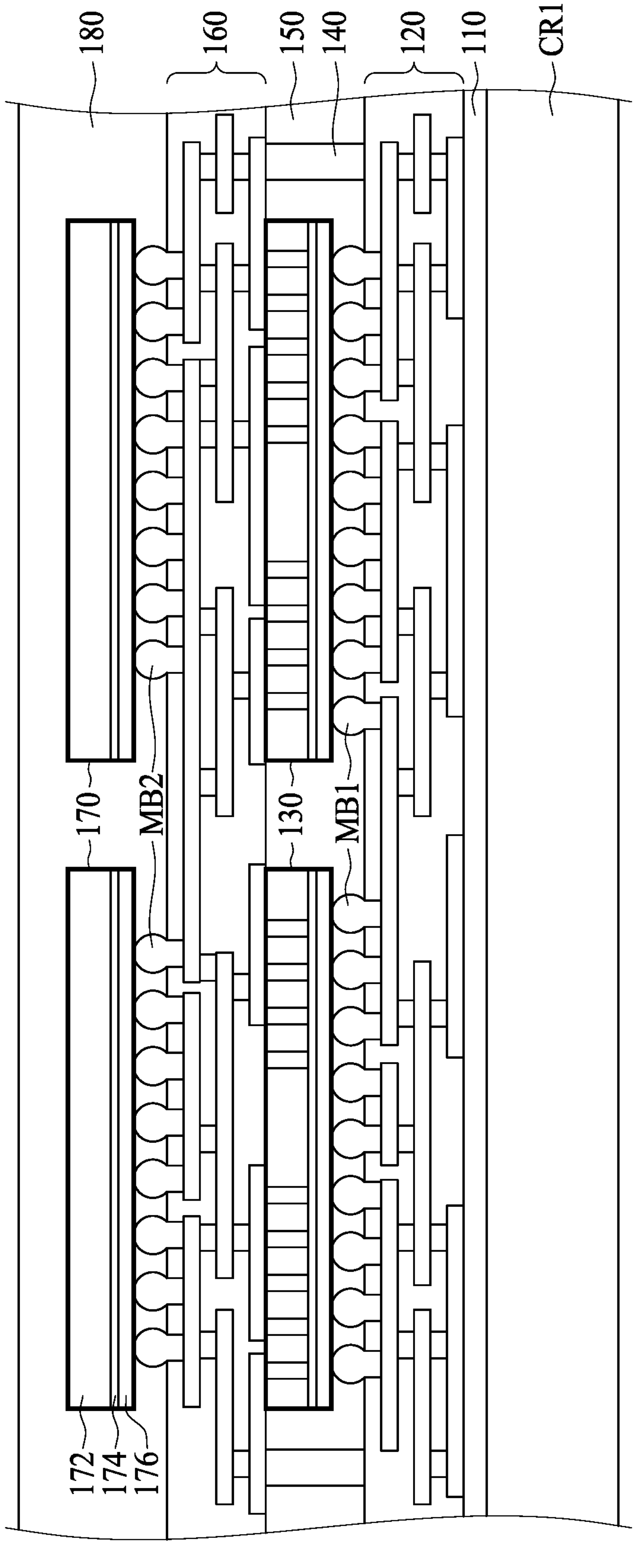
Figure 6L:
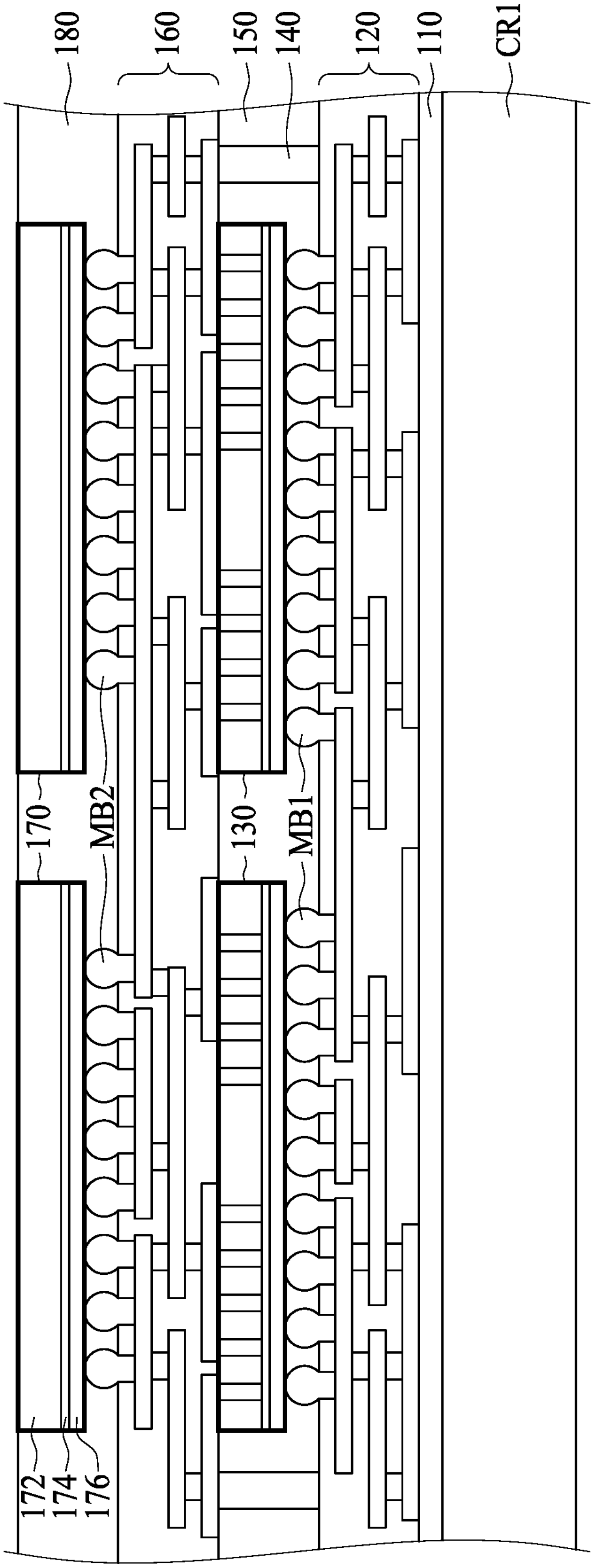
Figure 6M:
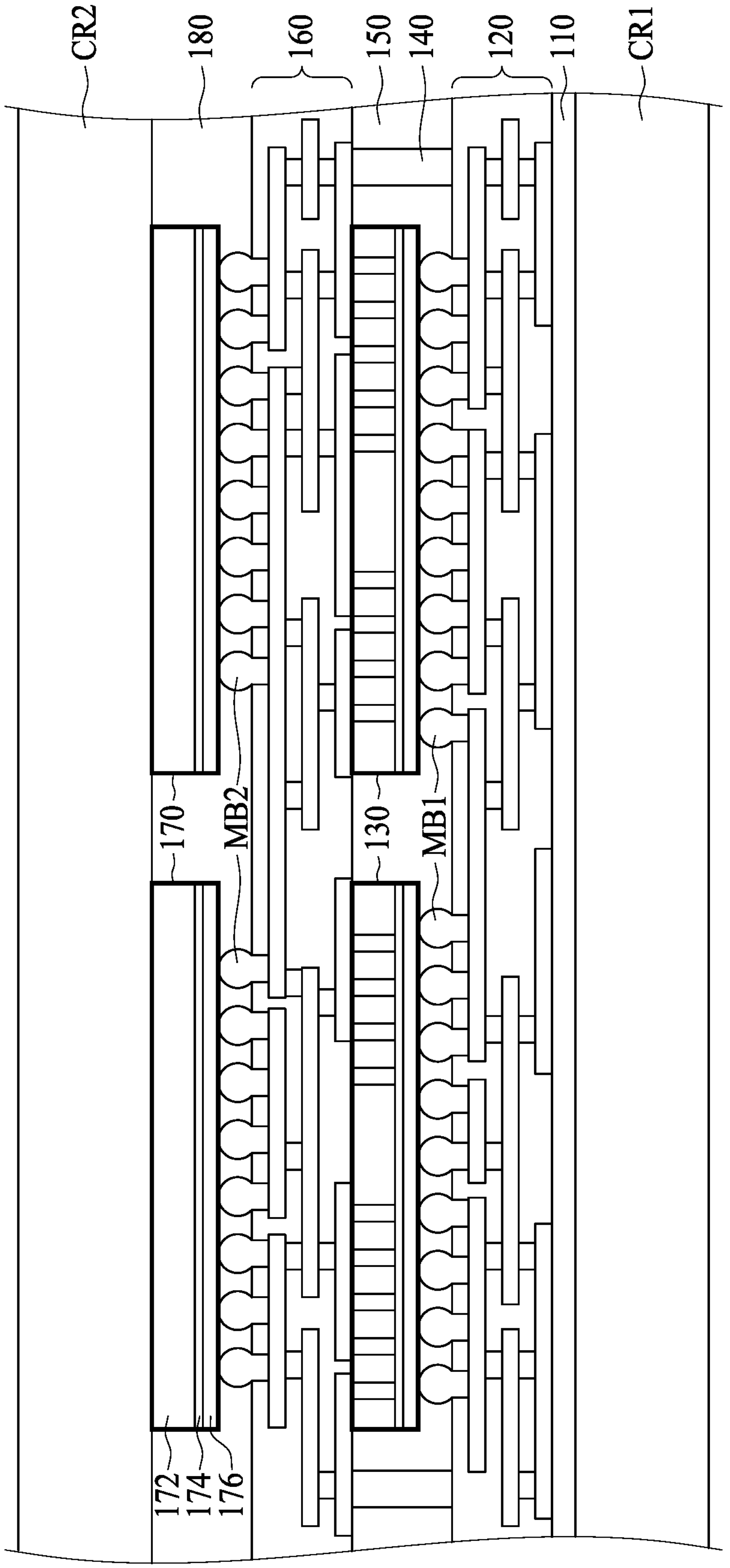
Figure 6N:
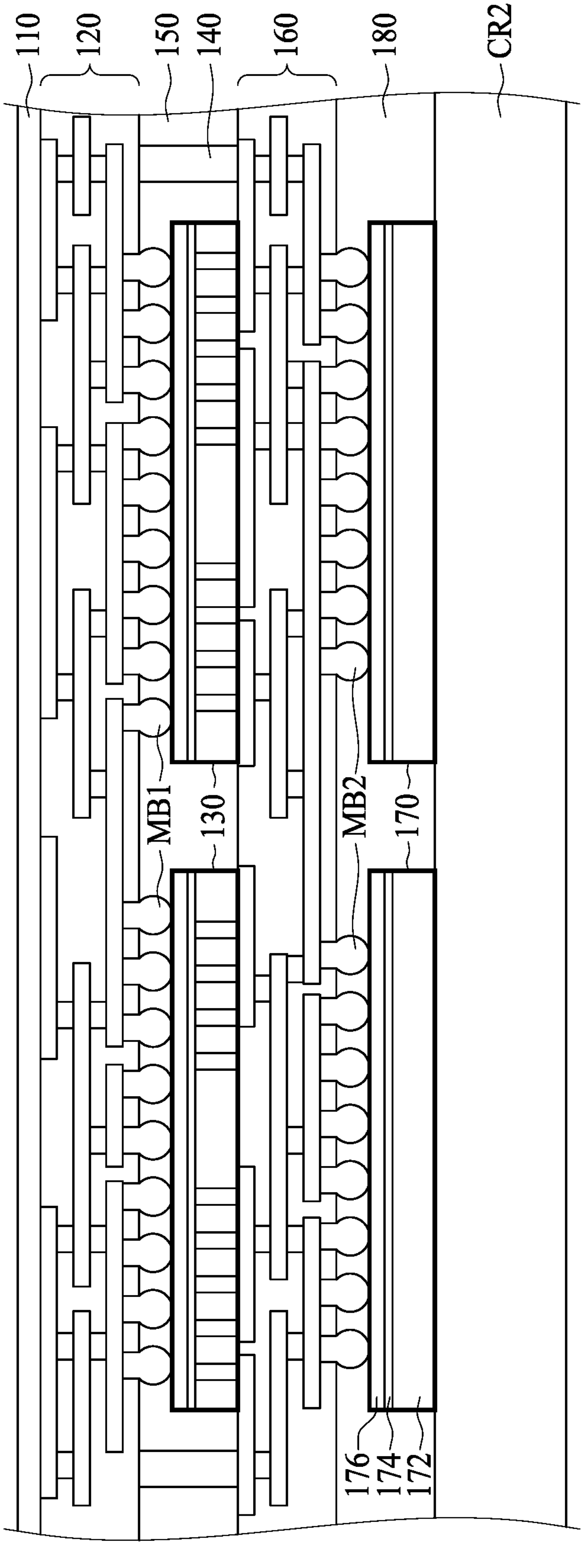
Figure 6O:
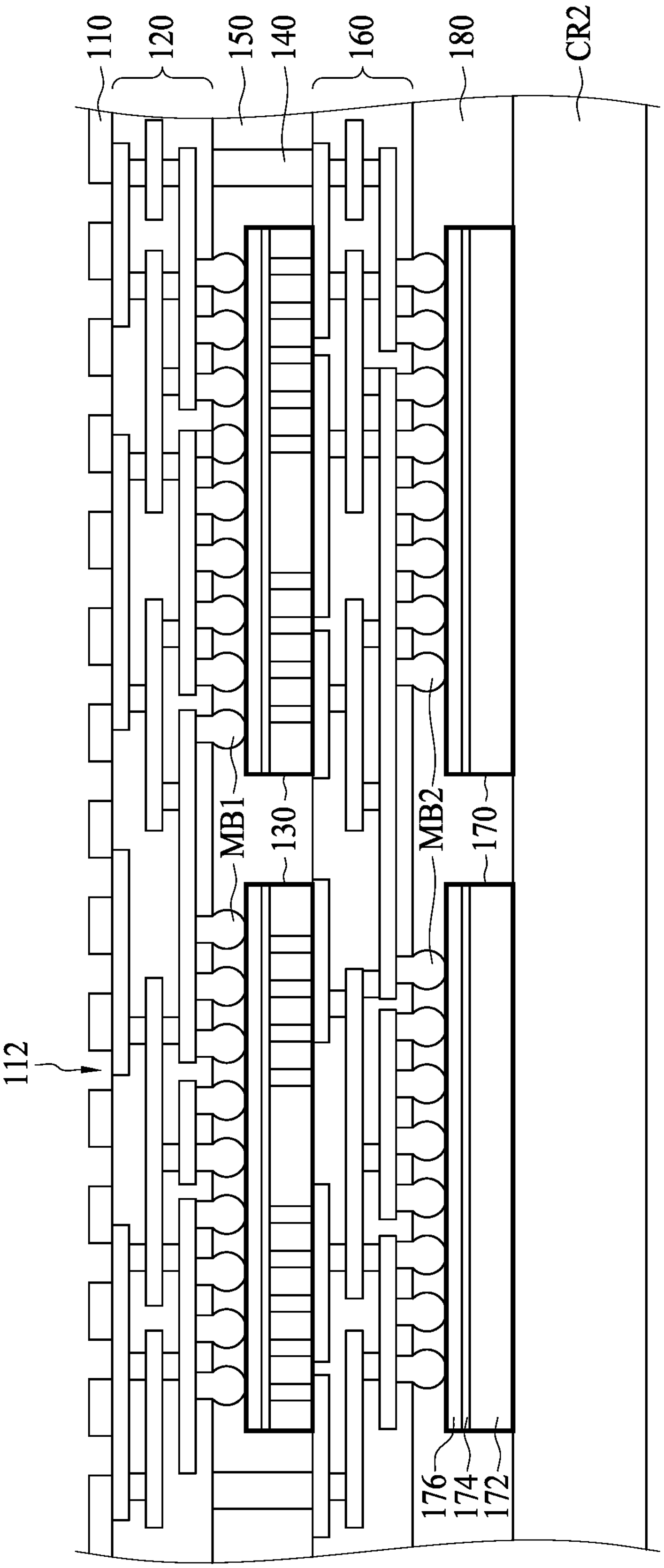
Figure 6P:
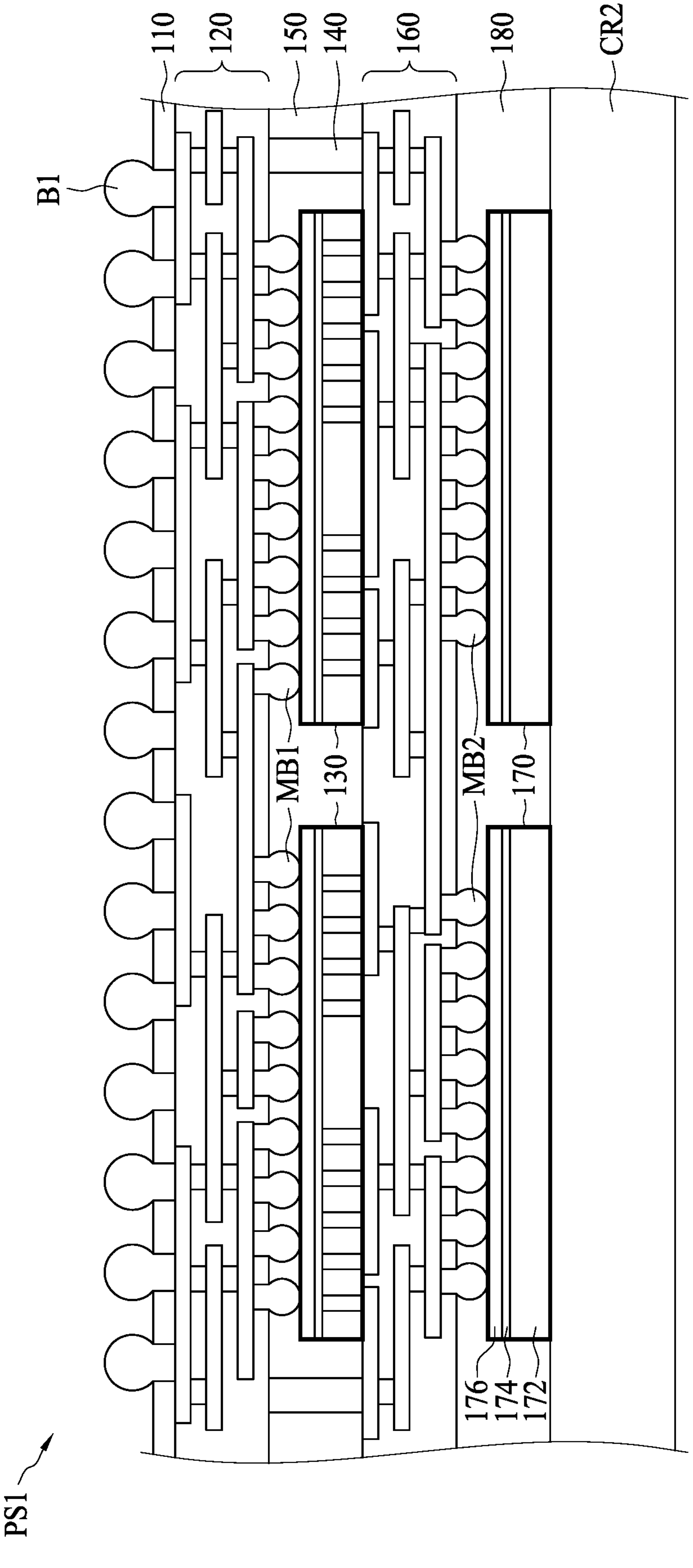
Figure 6Q:
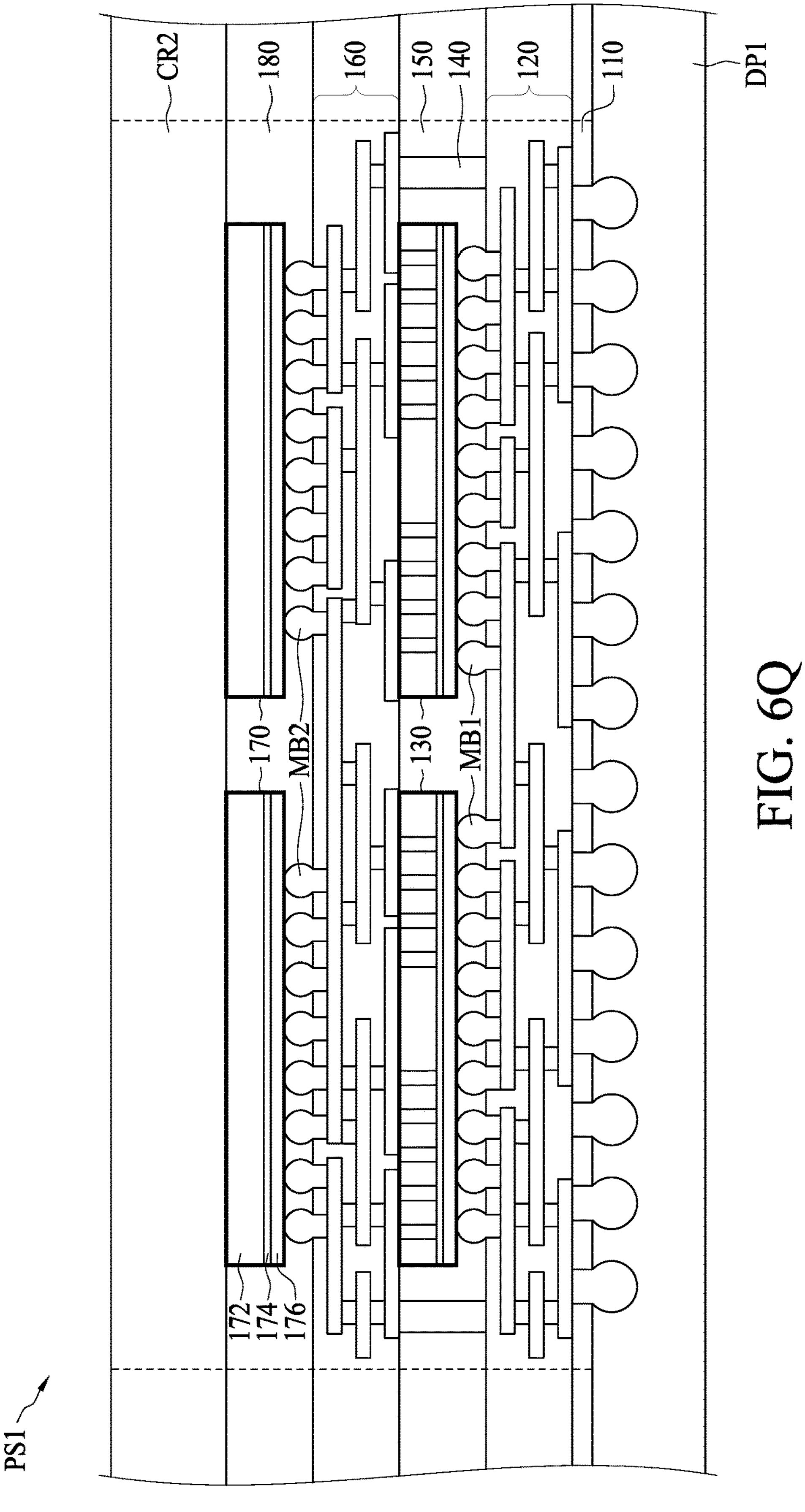
Figure 6R:
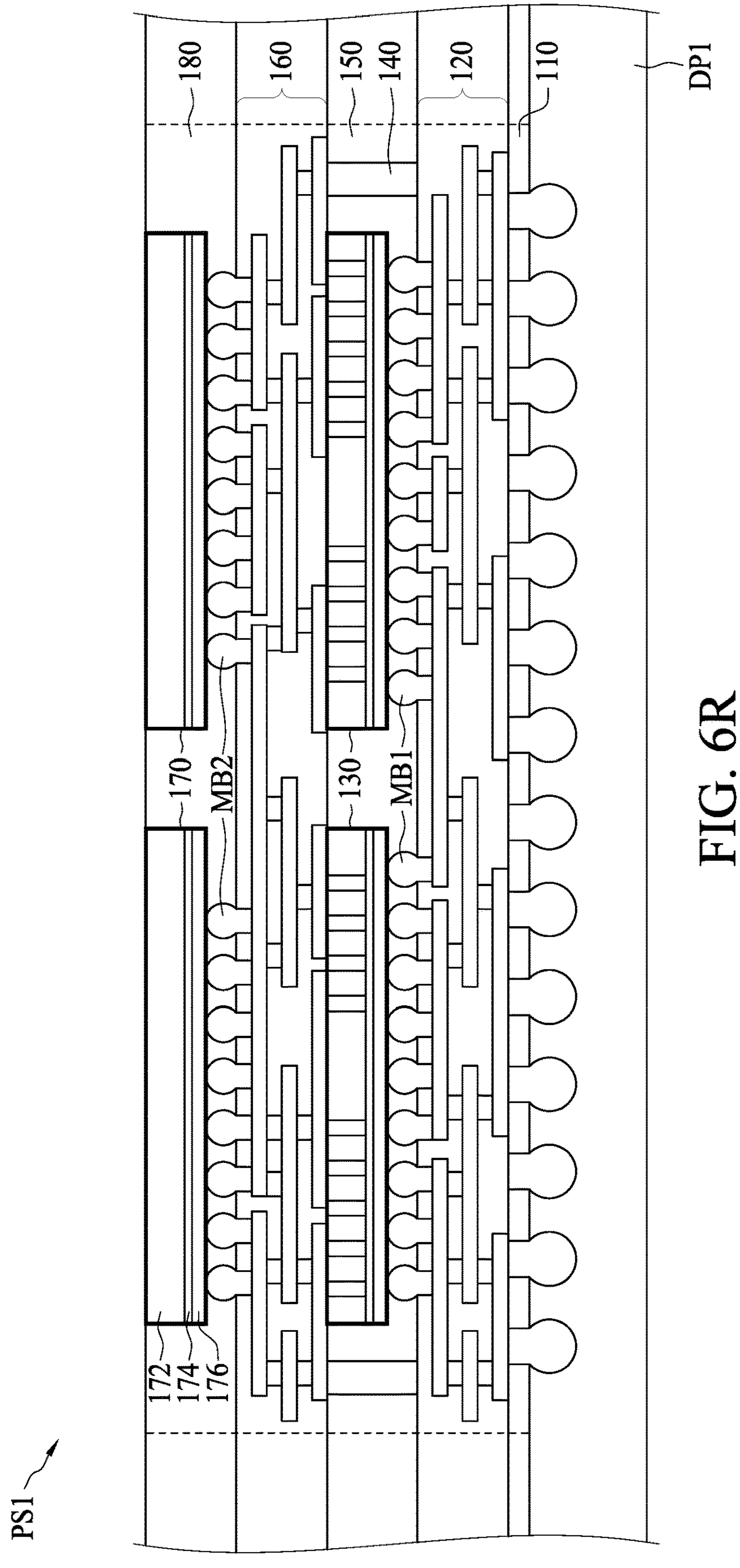
Figure 6S:
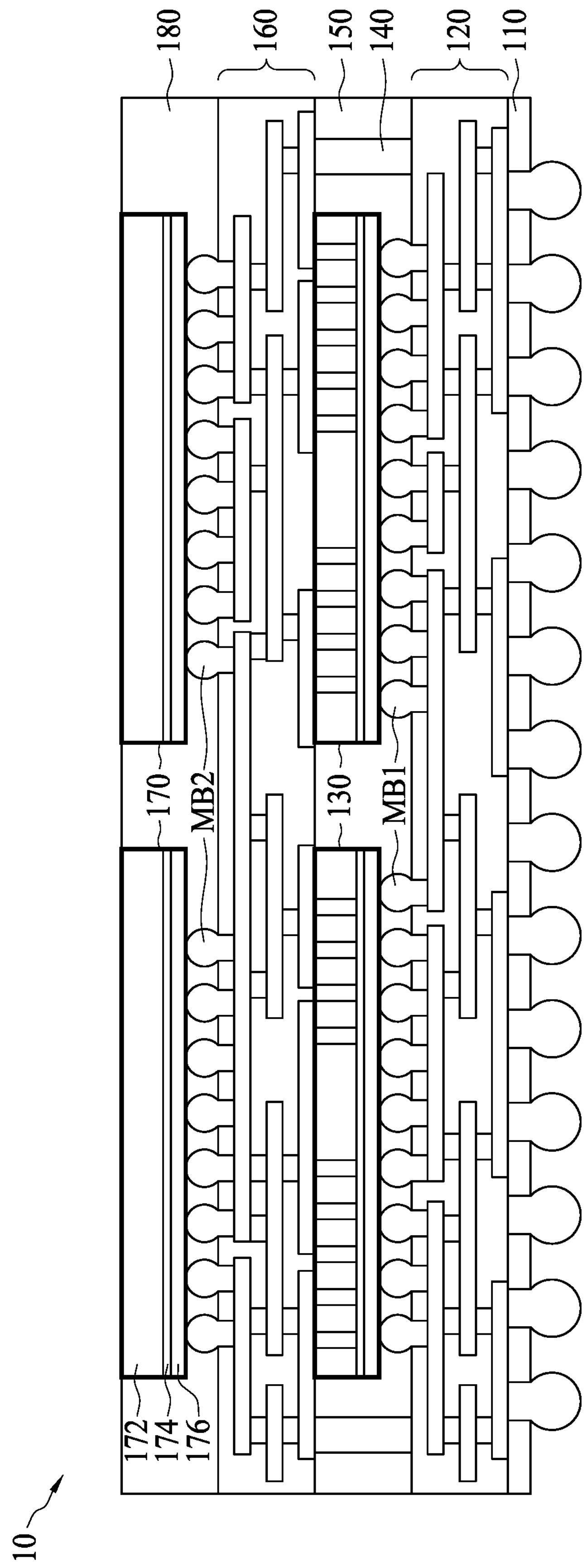

The method M1 includes steps S402 to S438, and FIGS. 6A to 6S are schematic, cross-sectional diagrams showing a manufacturing process according to steps S402 to S438 of the method M1.

In step S402, the dielectric layer 110 can be formed on a carrier CR1 as shown in FIG. 6A. In some embodiment, the carrier CR1 can be made of glass, and an adhesive layer (not shown in FIG. 6A) may be applied on the carrier CR1 before the dielectric layer 110 is deposited. The adhesive layer may include suitable materials that allows the dielectric layer 110 to be detached from the carrier CR1 without being damaged in a later step. In some embodiments, the carrier CR1 of glass can be reused in another round of manufacturing process so as to save the cost.

In step S404, the RDL 120 can be formed on a first surface of the dielectric layer 110 as shown in FIG. 6B, and in steps S406 and S408, the micro bumps MB1 and the conductive pillars 140 can be formed on the RDL 120 as shown in FIGS. 6C and 6D. In some embodiments, the conductive pillars 140 can, for example, but not limited to, include copper, aluminum, gold, silver, nickel, tin, platinum, or a combination of the foregoing. Also, the micro bumps MB1 can, for example, but not limited to, include copper, gold, nickel, tin or a combination of the foregoing.

Furthermore, the micro bumps MB1 and the conductive pillars 140 may have similar pitches and widths. For example, the pitches of the micro bumps MB1 and the conductive pillars 140 may be 40 μm, the widths of the micro bumps MB1 can be 22 μm, and the widths of the conductive pillars 140 can be 25 μm. However, since the heights of the conductive pillar 140 (e.g., 70 μm) is greater than the heights of the micro bumps 140 (e.g., 25 μm), the micro bumps 140 and the conductive pillars 140 are formed in different steps so that the lithography process can be performed with better accuracy. In the present embodiment, the micro bumps 140 may be formed in step S406 before the conductive pillars 140 is formed in step S408.

After the conductive pillars 140 is formed, the bottom dies 130 can be provided and attached to the micro bumps MB1 in step S410 as shown in FIG. 6E. In the present embodiment, the bottom dies 130 can be disposed on the RDL 120 and attached to the micro bumps MB1 in a face-down manner. That is, the RDLs 136 of the bottom dies 130 can be coupled to the micro bumps MB1. In such case, the computation circuits 190 formed in the device layer 134 and the RDL 136 of the bottom dies 130 can communicate with each other through the RDL 120 under the micro bumps MB1. In the present embodiment, since the RDL 120 is formed before assembling the bottom dies 130, a better yield rate can be achieved.

Figure 7:
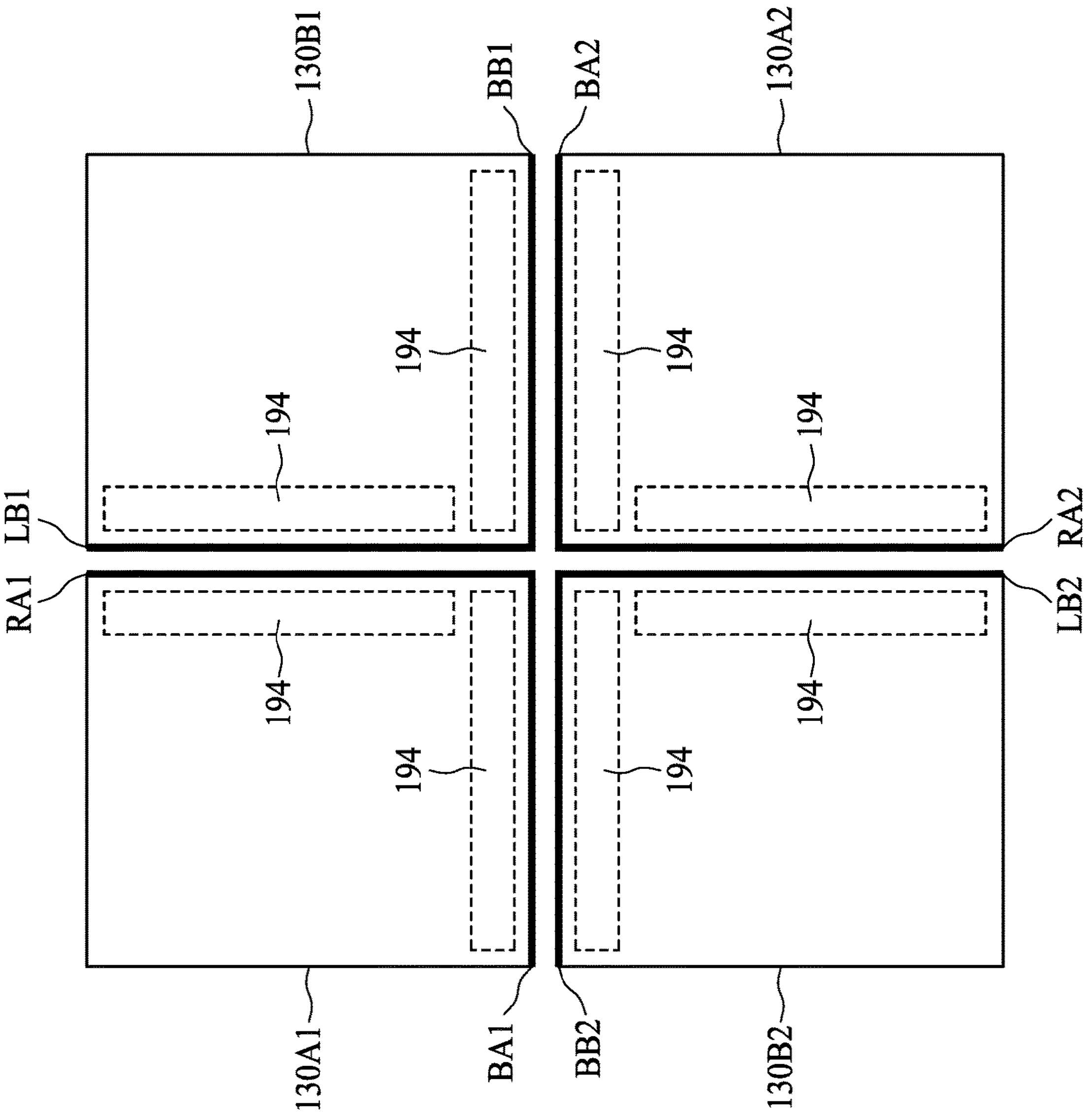
FIG. 7 shows a placement of the bottom dies in from a top view.

FIG. 7 shows a placement of the bottom dies 130 from a top view. As shown in FIG. 7, the semiconductor structure 100 includes four bottom dies 130A1, 130A2, 130B1, and 130B2. The bottom dies 130A1, 130A2, 130B1, and 130B2 have the same functions but may have different placements of components. In the present embodiment, the four bottom dies includes two bottom dies 130A1 and 130A2 of a first type and two bottom dies 130B1 and 130B2 of a second type. That is, the bottom dies 130A2 and 130A1 are identical, and can be manufactured with the same set of masks. Similarly, the bottom dies 130B1 and 130B2, and can be manufactured with another set of masks.

As shown in FIG. 7, each of the bottom dies 130A1, 130A2, 130B1, and 130B2 further includes two die-to-die connection circuits 194 disposed along two adjacent edges respectively. Each of the bottom dies 130A1 and 130A2 of the first type has its two die-to-die connection circuits 194 placed along its right edge and its bottom edge, and each of the bottom dies 130B1 and 130B2 of the second type has its two die-to-die connection circuits 194 placed along its left edge and it bottom edge.

In addition, the two bottom dies 130A1 and 130A2 of the first type and the two bottom dies 130B1 and 130B2 of the second type are disposed in a staggered manner so that every die-to-die connection circuit 194 of every bottom die is adjacent to another die-to-die connection circuit 194 of another bottom die. For example, the bottom die 130A1 includes one die-to-die connection circuit 194 along its right edge RA1 and another die-to-die connection circuit 194 along it bottom edge BA1. Also, the bottom die 130B1 includes one die-to-die connection circuit 194 along its left edge LB1 and another die-to-die connection circuit 194 along it bottom edge BB1. In such case, since the right edge RA1 of the bottom die 130A1 is adjacent to the left edge LB1 of the bottom die 130B1, the die-to-die connection circuits 194*s* of the bottom dies 130A1 and 130B1 can be coupled through the RDL 120 with shorter routing traces.

Furthermore, the bottom die 130B2 is rotated by 180 degrees with respect of the bottom die 130B1 so the die-to-die connection circuit 194 of the bottom die 130B2 along its bottom edge BB2 is adjacent to the die-to-die connection circuit 194 of the bottom die 130A1 along its bottom edge BA1. Similarly, the bottom die 130A2 is rotated by 180 degrees with respect of the bottom die 130A1 so the die-to-die connection circuit 194 of the bottom die 130A2 along its bottom edge BA2 is adjacent to the die-to-die connection circuit 194 of the bottom die 130B1 along its bottom edge BB1. Furthermore, in such case, the die-to-die connection circuit 194 of the bottom die 130B2 along its left edge LB2 is adjacent to the die-to-die connection circuit 194 of the bottom die 130A2 along its right edge RA2. Therefore, with the staggered arrangement shown in FIG. 7, routing traces between die-to-die connection circuits 194 of the bottom dies 130A1, 130A2, 130B1, and 130B2 can be shortened.

Figure 8:
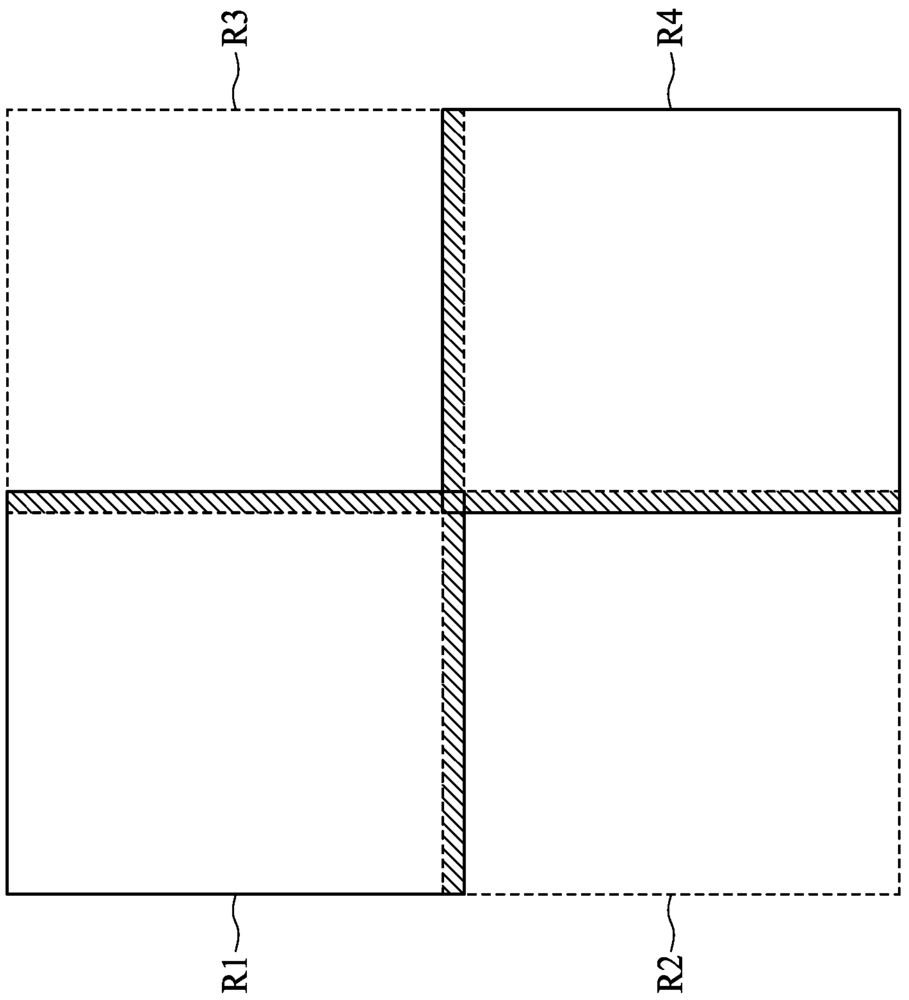
FIG. 8 shows the stitching reticles used for forming the RDL according to one embodiment of the present disclosure.

In addition, in some embodiments, if the bottom dies 130A1, 130A2, 130B1, and 130B2 are manufactured by reticles of the largest size available, then the step S404 for forming the RDL 120 may include performing a lithography process by stitching a plurality of masks. For example, if the bottom dies 130A1, 130A2, 130B1, and 130B2 are each formed with a reticle having the largest size available, for example, a size of 26 mm×33 mm, then the RDL 120 may be formed by stitching four reticles having the same size. In such case, the semiconductor structure 100 may have a size of 52 mm×66 mm. FIG. 8 shows the stitching reticles used for forming the RDL 120 according to one embodiment of the present disclosure. As shown in FIG. 8, the RDL 120 can be formed by using four sets of reticles R1, R2, R3, and R4. Furthermore, in some embodiments, to ensure the traces crossing different reticles can be aligned without interrupted, overlapping regions between each two adjacent reticles may be required. In such case, although the bottom dies 130A1, 130A2, 130B1, and 130B2 may be manufactured by reticles having a size of 26 mm×33 mm, the actual size of the bottom dies 130A1, 130A2, 130B1, and 130B2 should be smaller. In addition, spaces between bottom dies should be preserved for the conductive pillars 140.

Although the RDL 120 can be formed by stitching four reticles in the embodiment of FIG. 8, the present disclosure is not limited thereto. In some other embodiments, the designer may stitching only two reticles or stitching even more reticles if the process allows. Or, in some embodiments, if the bottom dies 130A1, 130A2, 130B1, and 130B2 are rather small, then reticle stitching may not be required.

After the bottom dies 130 are attached, the molding layer 150 can be formed to fill the spaces among and around the bottom dies 130 and the conductive pillars 140 on the RDL 120 in step S412 as shown in FIG. 6F. In some embodiment, the step S412 may include applying underfill material to fill the spaces under the bottom dies 130 and applying molding material to mold the underfill UF1 and the bottom dies 130. However, in the present embodiment, step S412 may be performed by one single procedure by using MUF materials.

In step S414, a backside of the molding layer 150 and the bottom dies 130 are grinded to expose the TSVs 138 of the bottom die 130 and the conductive pillars 140 as shown in FIG. 6G. In such case, the RDL 160 can be further formed on the molding layer 150 in step S416 so that the RDL 160 can be coupled to the TSVs 138 of the bottom die 130 and the conductive pillars 140 as shown in FIG. 6H. Afterwards, the micro bumps MB2 can be formed on the RDL 160 in step S418 as shown in FIG. 6I, and the top dies 170 can be attached to the micro bumps MB2 in step S420 as shown in FIG. 6J.

In the present embodiment, the top dies 170 may include four top dies, and the top dies 170 and the bottom dies 130 can all be the chiplet core dies. In such case, the top dies 170 and the bottom dies 130 can be manufactured by same sets of reticles. For example, the top dies 170 may also include two top dies 170 of the first type that are same as the bottom dies 130A1 and 130A2 and another two top dies 170 of the second type that are same as the bottom dies 130B1 and 130B2. In addition, the top dies 170 can be placed on the RDL 160 with the similar arrangement of the bottom dies 130A1, 130A2, 130B1, and 130B2 shown in FIG. 7. That is, the two top dies 170 of the first type and the two top dies 170 of the second type can be disposed in a staggered manner so that every die-to-die connection circuit of every top die 170 can be adjacent to another die-to-die connection circuit of another top die 170, thereby shortening the routing traces between dies. Furthermore, in such case, the RDL 160 may also be formed by using stitching reticles as shown in FIG. 8.

After the top dies 170 are assembled to the micro bumps MB2, the molding layer 180 can be formed on the top dies 170 in step S422 as shown in FIG. 6K. In some embodiments, the step S422 may include applying underfill material to fill the spaces under the top dies 170 and applying molding material to mold the top dies 170. However, in the present embodiment, step S422 may be performed by one single procedure by using MUF materials.

In step S424, a backside of the molding layer 180 is grinded to expose surfaces of the top dies 170 as shown in FIG. 6L. In some embodiments, the backsides of the top dies 170 may also be grinded and thinned, so that the overall thickness of the semiconductor structure 100 can be reduced.

In step S426, a carrier CR2 can be adhered on the backsides of the top dies 170 as shown in FIG. 6M, and the carrier CR1 can be detached in step S428. In FIG. 6N, the carrier CR1 has been detached and the semiconductor structure 100 is flipped upside down. In some embodiments, the carrier CR2 can be made of glass, and can be adhered on the backsides of the top dies 170 and the molding MD2 with an adhesive layer that allows the carrier CR2 to be detached from the surface of the top dies 170 and the molding MD2 without being damaged in a later step.

In step S430, a plurality of openings 112 can be formed in the dielectric layer 110 as shown in FIG. 6O, and in step S432, the bumps B1 can be formed in the openings 112 on a second surface of the dielectric layer 110 as shown in FIG. 6P. At this stage, an intermediate package structure PS1 including a plurality of semiconductor structures 100 has been formed. Therefore, to obtain the individual semiconductor structure 100, the intermediate package structure PS1 can be flipped and placed on a dicing tape DPI in step S434 as shown in FIG. 6Q.

Afterward, the carrier CR2 is detached from the surface of the top dies 170 and the molding layer 180 in step S436 as shown in FIG. 6R, and the intermediate package structure PS1 can be diced in step S438. As a result, the semiconductor structure 100 can be obtained as shown in FIG. 6S.

Figure 9:
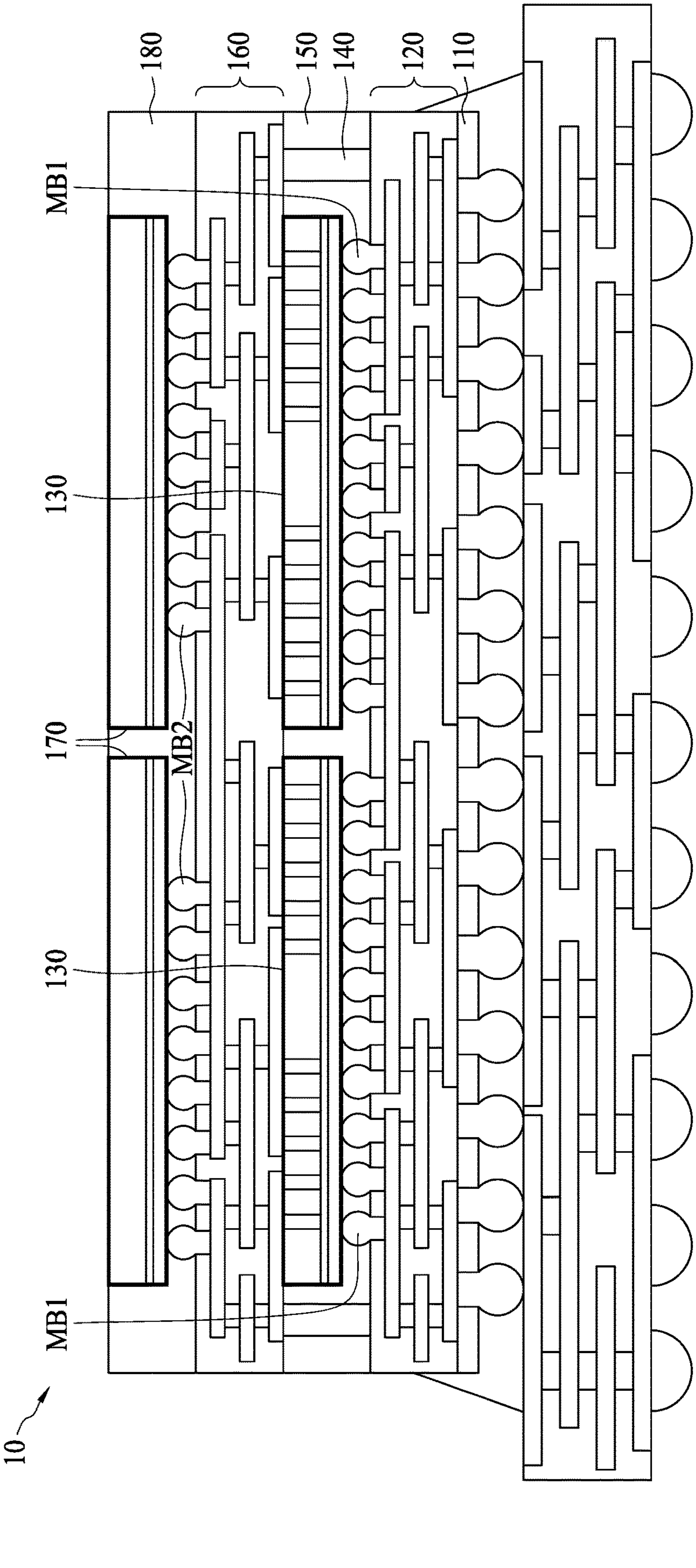
FIG. 9 shows a semiconductor device including the semiconductor structure in FIG. 1.

In some embodiments, the semiconductor structure 100 can be packaged as a semiconductor device or a chip. FIG. 9 shows a semiconductor device 10 including the semiconductor structure 100. As shown in FIG. 9, the semiconductor structure 100 is assembled on the substrate S1, and is packaged as the semiconductor device 10.

In summary, the semiconductor structure and the method for manufacturing the semiconductor structure adopts the die-stacking structure to accommodate multiple core dies within one package. The die-stacking structure not only allows greater computation capability within a smaller area but also enables faster data sharing and/or data switching.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure comprising:

a dielectric layer;

a first redistribution layer (RDL) disposed on a first surface of the dielectric layer;

a plurality of bumps disposed on a second surface of the dielectric layer;

a plurality of first micro bumps disposed on the first RDL;

a plurality of conductive pillars disposed on the first RDL;

at least one bottom die attached to the plurality of first micro bumps;

a first molding layer configured to fill spaces among and around the at least one bottom die and the plurality of conductive pillars on the first RDL;

a second RDL disposed on the first molding layer, wherein the second RDL is coupled to the at least one bottom die, and the second RDL further coupled to the plurality of conductive pillars;

a plurality of second micro bumps disposed on the second RDL; and a plurality of top dies attached to the plurality of second micro bumps.

2. The semiconductor structure of claim 1, further comprising:

a second molding layer disposed on the second RDL and configured to fill spaces among and around the plurality of top dies.

3. The semiconductor structure of claim 1, wherein each of the plurality of top dies comprises a computation circuit.

4. The semiconductor structure of claim 3, wherein a computation circuit of a top die of the plurality of top dies is coupled to a computation circuit of another top die of the plurality of top dies through the second RDL.

5. The semiconductor structure of claim 3, wherein the at least one bottom die comprises at least one memory circuit or a plurality of deep trench capacitors, and the computation circuit of each of the plurality of top dies is coupled to the at least one memory circuit or the plurality of deep trench capacitors through the second RDL.

6. The semiconductor structure of claim 3, wherein each of the plurality of top dies further comprises at least one die-to-die connection circuit disposed along an edge of each of the plurality of top dies, and a first top die and a second top die of the plurality of top dies are disposed on the second RDL, the first top die has a first edge and a second edge opposite to the first edge of the first top die, the second top die has a first edge and a second edge opposite to the first edge of the second top die, the first edge of the first top die is closer to the first edge of the second top die than the second edge of the first top die is, the first edge of the second top die is closer to the first edge of the first top die than the second edge of the second top die is, a first die-to-die connection circuit of the first top die is disposed along the first edge of the first top die, and a first die-to-die connection circuit of the second top die is disposed along the first edge of the second top die.

7. The semiconductor structure of claim 6, wherein:

the first top die and a third top die of the plurality of top dies are of a first type and the second top die and a fourth top die of the plurality of top dies are of a second type;

each of the plurality of top dies further comprises two die-to-die connection circuits disposed along two adjacent edges respectively; and the first top die has a third edge between the first edge and the second edge of the first top die, and a fourth edge opposite to the third edge of the first top die, the fourth top die has a first edge and a second edge opposite to the first edge of the fourth top die, the third edge of the first top die is closer to the first edge of the fourth top die than the fourth edge of the first top die is, the first edge of the fourth top die is closer to the third edge of the first top die than the second edge of the fourth top die is, a second die-to-die connection circuit of the first top die is disposed along the third edge of the first top die, and a first die-to-die connection circuit of the fourth top die is disposed along the first edge of the fourth top die; and the second top die has a third edge between the first edge and the second edge of the second top die, and a fourth edge opposite to the third edge of the second top die, the third top die has a first edge and a second edge opposite to the first edge of the third top die, the third edge of the second top die is closer to the first edge of the third top die than the fourth edge of the second top die is, the first edge of the third top die is closer to the third edge of the second top die than the second edge of the third top die is, a second die-to-die connection circuit of the second top die is disposed along the third edge of the second top die, and a first die-to-die connection circuit of the third top die is disposed along the first edge of the third top die.

8. The semiconductor structure of claim 3, wherein the at least one bottom die comprises a computation circuit.

9. The semiconductor structure of claim 8, wherein the computation circuit of the at least one bottom die is coupled to a computation circuit of a top die of the plurality of top dies through the second RDL.

10. The semiconductor structure of claim 8, wherein the computation circuit of the at least one bottom die is coupled to a computation circuit of another bottom die through the first RDL.

11. The semiconductor structure of claim 1, wherein the at least one bottom die comprises a device layer, a redistribution layer, and a backside substrate, and the at least one bottom die is attached to the plurality of first micro bumps with the device layer and the redistribution layer facing the plurality of first micro bumps and with the backside substrate distal from the plurality of first micro bumps.

12. The semiconductor structure of claim 1, wherein the at least one bottom die comprises a device layer, a redistribution layer, and a backside substrate, and the at least one bottom die is attached to the plurality of first micro bumps with the backside substrate facing the plurality of first micro bumps and with the device layer and the redistribution layer distal from the plurality of first micro bumps.

13. The semiconductor structure of claim 1, wherein each of the plurality of top dies comprises a device layer, a redistribution layer, and a backside substrate, and the plurality of top dies are attached to the plurality of second micro bumps with the device layer and the redistribution layer facing the plurality of second micro bumps and with the backside substrate distal from the plurality of second micro bumps.

14. A semiconductor device, comprising:

a substrate; and the semiconductor structure of claim 1 assembled on the substrate.

15. A semiconductor structure comprising:

a dielectric layer;

a first redistribution layer (RDL) disposed on a first surface of the dielectric layer;

a plurality of bumps disposed on a second surface of the dielectric layer;

a plurality of first micro bumps disposed on the first RDL;

at least one bottom die attached to the plurality of first micro bumps;

a first molding layer configured to fill spaces among and around the at least one bottom die on the first RDL;

a second RDL disposed on the first molding layer, wherein the second RDL is coupled to the at least one bottom die;

a plurality of second micro bumps disposed on the second RDL;

a plurality of top dies attached to the plurality of second micro bumps; and a second molding layer disposed on the second RDL and configured to fill spaces among and around the plurality of top dies.

16. The semiconductor structure of claim 15, wherein each of the plurality of top dies comprises a computation circuit.

17. The semiconductor structure of claim 16, wherein the at least one bottom die comprises at least one memory circuit or a plurality of deep trench capacitors, and the computation circuit of each of the plurality of top dies is coupled to the at least one memory circuit or the plurality of deep trench capacitors through the second RDL.

18. The semiconductor structure of claim 16, wherein each of the plurality of top dies further comprises at least one die-to-die connection circuit disposed along an edge of each of the plurality of top dies, and the plurality of top dies are disposed on the second RDL in a manner allowing a die-to-die connection circuit of a top die of the plurality of top dies to be adjacent to a die-to-die connection circuit of another top die of the plurality of top dies.

19. The semiconductor structure of claim 16, wherein:

the plurality of top dies comprise two top dies of a first type and two top dies of a second type;

each of the plurality of top dies further comprises two die-to-die connection circuits disposed along two adjacent edges respectively; and the two top dies of the first type and the two top dies of the second type are disposed in a staggered manner with every die-to-die connection circuit of every top die adjacent to another die-to-die connection circuit of another top die.

20. The semiconductor structure of claim 15, wherein a circuit of the at least one bottom die is coupled to a circuit of a top die of the plurality of top dies through the second RDL and the plurality of second micro bumps.

* * * * *